(12) United States Patent
Lee et al.

(10) Patent No.: US 8,748,970 B1
(45) Date of Patent: Jun. 10, 2014

(54) SEMICONDUCTOR DEVICE AND METHOD OF MANUFACTURING THE SAME

(71) Applicant: SK hynix Inc., Icheon-si (KR)

(72) Inventors: Ki Hong Lee, Suwon-si (KR); Seung Ho Pyi, Seongnam-si (KR); Hyun Soo Shon, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/830,617

(22) Filed: Mar. 14, 2013

(30) Foreign Application Priority Data

Dec. 11, 2012 (KR) .......................... 10-2012-0143588

(51) Int. Cl.
 *H01L 29/792* (2006.01)
 *H01L 29/775* (2006.01)

(52) U.S. Cl.
 CPC .............. *H01L 29/792* (2013.01); *H01L 29/775* (2013.01)
 USPC ...................................................... 257/324

(58) Field of Classification Search
 CPC ...... H01L 29/788; H01L 29/775; H01L 29/78
 USPC ................ 257/315, 316, 686, 288, 324; 365/185.17
 See application file for complete search history.

(56) References Cited

U.S. PATENT DOCUMENTS

| | | | |
|---|---|---|---|
| 7,307,338 B1 * | 12/2007 | Mandell et al. | 257/643 |
| 8,476,749 B2 * | 7/2013 | Drost et al. | 257/686 |
| 8,487,422 B2 * | 7/2013 | Dunne | 257/686 |
| 8,541,819 B1 * | 9/2013 | Or-Bach et al. | 257/211 |
| 2010/0133599 A1 * | 6/2010 | Chae et al. | 257/315 |
| 2013/0313631 A1 * | 11/2013 | Yang et al. | 257/329 |

FOREIGN PATENT DOCUMENTS

| | | | |
|---|---|---|---|
| KR | 1020110042619 A | | 4/2011 |
| KR | 1020120026435 A | | 3/2012 |
| KR | 1020140008622 A | | 1/2014 |

* cited by examiner

*Primary Examiner* — Nathan Ha
(74) *Attorney, Agent, or Firm* — William Park & Associates Patent Ltd.

(57) ABSTRACT

A semiconductor device having reduced contact region area achieved at least in part by forming pad portions of the word lines using an asymmetric stair shape separately formed in first and second pad structures. Contact region area is reduced when compared with manufacturing processes known in the art. This leads to an increase in device integrity and a less complex manufacturing process.

20 Claims, 24 Drawing Sheets

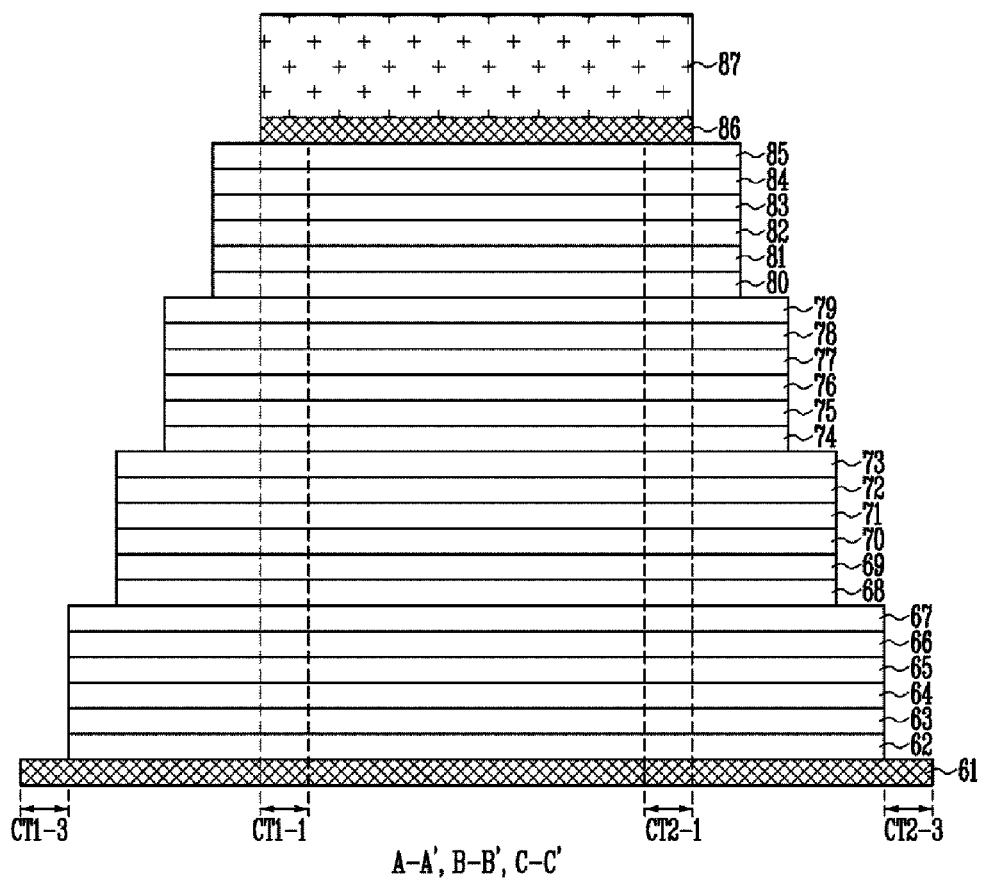

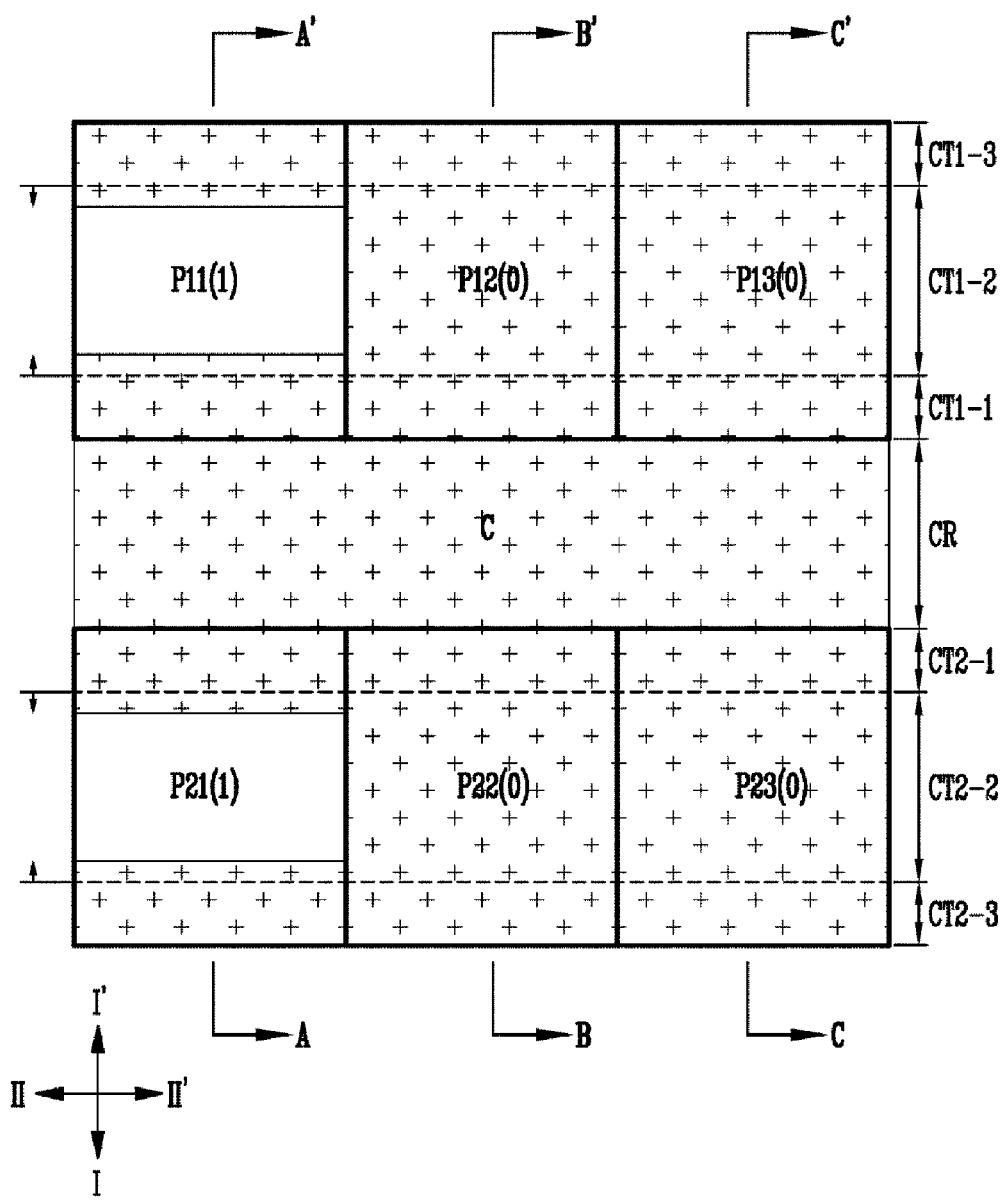

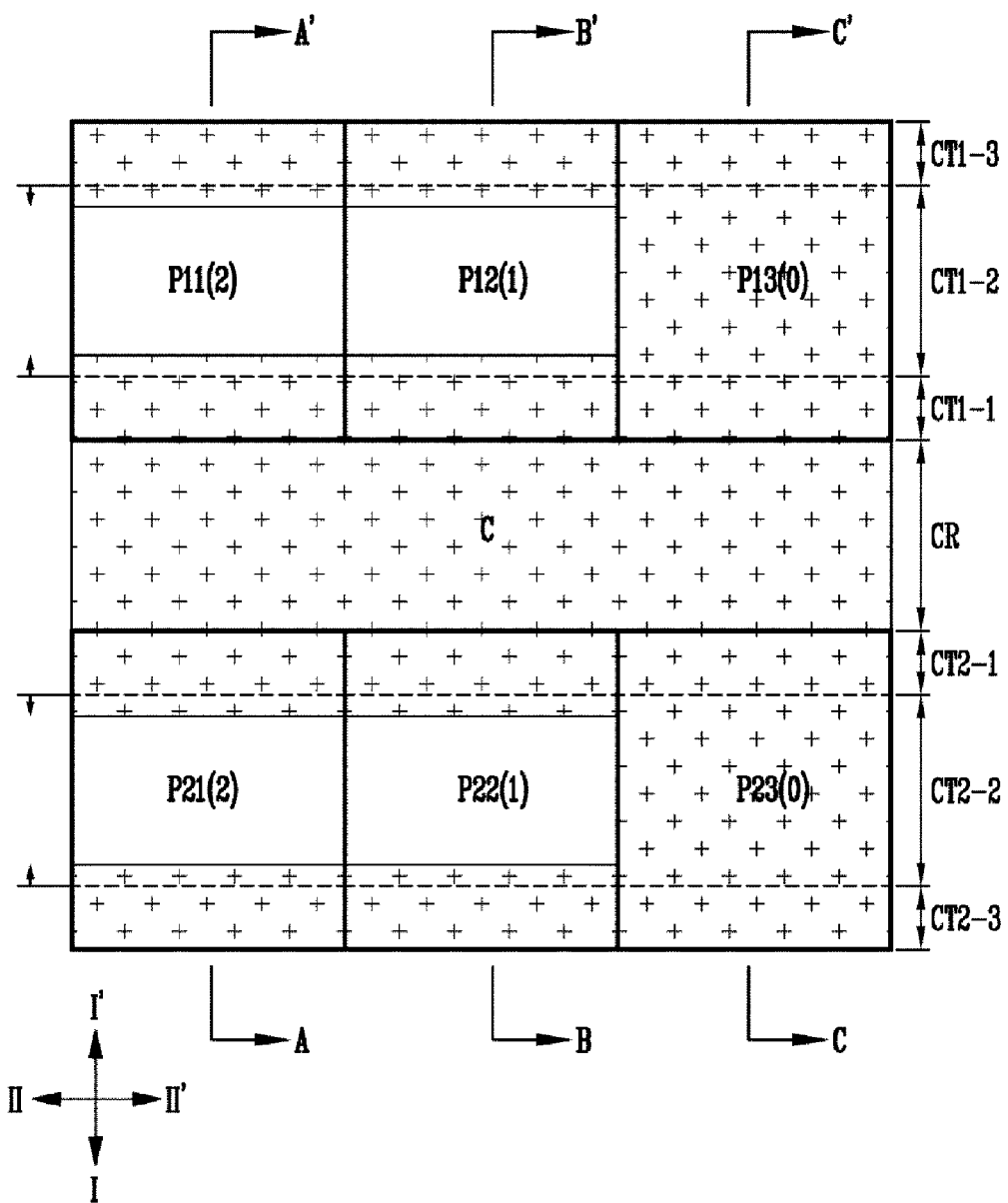

B-B'

SEMICONDUCTOR DEVICE AND METHOD OF MANUFACTURING THE SAME

CROSS-REFERENCE TO RELATED APPLICATION

This application claims priority from Korean Patent Application No. 10-2012-0143588, filed on Dec. 11, 2012, the contents of which are incorporated herein by reference in its entirety.

BACKGROUND

1. Field

The present invention relates generally to a semiconductor device and a method of manufacturing the same, and in particular to a three-dimensional semiconductor device and a method of manufacturing the same.

2. Discussion of Related Art

A non-volatile memory device is a memory device in which stored data is retained even after power is removed. Recently, a three-dimensional non-volatile memory device, where memory cells are vertically stacked on a silicon substrate, has been developed in response to the perception that two-dimensional memory devices are pushing the boundaries of device integrity. Memory cells are formed with one layer on a silicon substrate in the two-dimensional memory device.

The three-dimensional non-volatile memory device accesses a desired memory cell by supplying appropriate biases to word lines stacked on the substrate. When the memory device is manufactured, pad portions of respective word lines are defined by patterning a contact region of stacked word lines in a stair configuration, and then connecting contact plugs to the pad portions of the word lines. During manufacture, an etching process is iteratively performed by reducing one mask pattern so as to pattern the stacked word lines in the desired stair configuration. Consequently, the process of manufacturing the memory device is complex and difficult to implement successfully. Since contact region area within the memory device is high, it is difficult to enhance the integrity of the memory device. Specifically, it is difficult to increase memory capacity while retaining high levels of performance and reliability.

SUMMARY OF THE INVENTION

An example embodiment of the present invention is directed toward a semiconductor device featuring enhanced device integrity as well as a simplified manufacturing process.

A semiconductor device according to an embodiment of the present invention comprises n first pad structures including first stack layers disposed in a stair configuration, with a step difference being formed between the first pad structures and n being a natural number greater than or equal to 1; n second pad structures including second stack layers disposed in a stair configuration, with a step difference being formed between the second pad structures; and a cell structure disposed between the first pad structures and the second pad structures. In the first pad structures, at least one uppermost step and at least one lowest step include, respectively, one first stack layer, while the other step includes 2n first stack layers. In the second pad structures, at least one uppermost step and at least one lowest step include, respectively, one second stack layer, while the other step includes 2n second stack layers.

A memory system according to an embodiment of the present invention comprises a memory controller; and a non-volatile memory device including a semiconductor device comprising: n first pad structures including first stack layers disposed in a stair configuration, with a step difference being formed between the first pad structures and n being a natural number greater than or equal to 1; n second pad structures including second stack layers disposed in a stair configuration, with a step difference being formed between the second pad structures; and a cell structure disposed between the first pad structures and the second pad structures, wherein, in the first pad structures, at least one uppermost step and at least one lowest step include, respectively, one first stack layer, while the other step includes 2n first stack layers, and in the second pad structures, at least one uppermost step and at least one lowest step include, respectively, one second stack layer, while the other step includes 2n second stack layers.

A semiconductor device in accordance with the present invention may enhance integrity by reducing contact region area. A method of manufacturing the semiconductor device may be simplified, where pad portions of a lower select line, an upper select line and word lines are easily formed.

BRIEF DESCRIPTION OF THE DRAWINGS

The above and other features and advantages of the present invention will become readily apparent by reference to the following detailed description when considered in conjunction with the accompanying drawings wherein:

FIG. 6a to FIG. 9d are views illustrating a process of manufacturing a semiconductor device according to another embodiment of the present invention;

DETAILED DESCRIPTION

Embodiments of the present invention are described below in more detail with reference to the accompanying drawings. The present invention may, however, be embodied in different forms and should not be construed as limited to the embodiments set forth herein.

Figure 1:
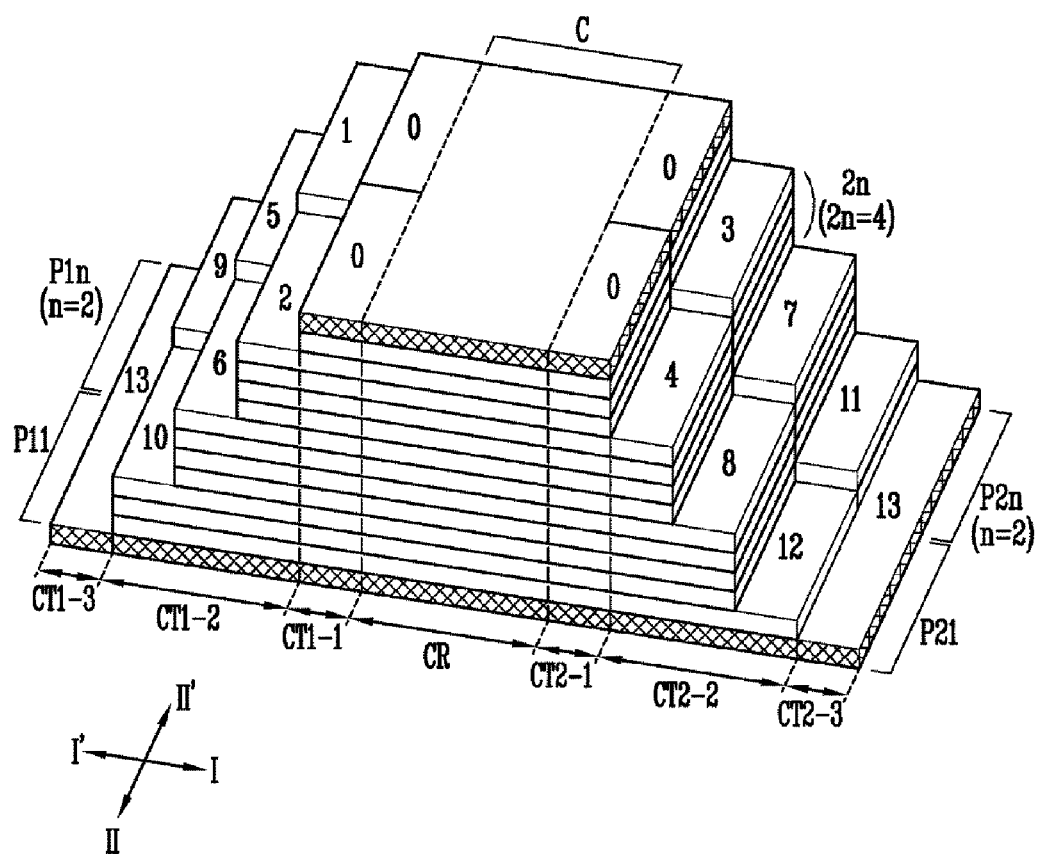
FIG. 1 is a perspective view illustrating a semiconductor device according to one embodiment of the present invention.

FIG. 1 is a perspective view illustrating a semiconductor device according to one embodiment of the present invention. FIG. 1 shows only a cell structure and a pad structure for convenience of description.

As shown in FIG. 1, the semiconductor device may include a cell structure C formed on a substrate (not shown) and first and second pad structures P11~P22. A cell region CR and first and second contact regions CT1-1~CT1-3 and CT2-1~CT2-3 located at both sides of the cell region CR are defined in the substrate.

The first contact regions CT1-1~CT1-3 should be interpreted to mean regions where the first pad structures P11 and P12 are to be formed. For example, the first contact regions CT1-1~CT1-3 may include a contact region CT1-1 of an upper select line, a contact region CT1-2 of word lines and a contact region CT1-3 of a lower select line. The second contact regions CT2-1~CT2-3 should be interpreted to mean regions where the second pad structures P21 and P22 are to be formed. For example, the second contact regions CT2-1~CT2-3 may include a contact region CT2-1 of the upper select line, a contact region CT2-2 of the word lines and a contact region CT2-3 of the lower select line. The cell region CR means a region where the cell structure C is to be formed, and may be disposed between the first contact regions CT1-1~CT1-3 and the second contact regions CT2-1~CT2-3.

The cell structure C and the first to the second pad structures P11~P22 may be formed by selectively etching one stack structure. For example, the cell structure C and the first and the second pad structures P11~P22 are connected to one another. Hereinafter, it is assumed that one stack structure is divided into the cell structure C and the first and the second pad structures P11~P22.

The first pad structures P11 and P12 include first stack layers, and are connected to one side of the cell structure C. For example, n first pad structures P11 and P12 are formed in the first contact regions CT1-1~CT1-3, n being for example 2 (n must be a natural number greater than or equal to 1). In each of the first pad structures P11 and P12, at least one uppermost step and at least one lowest step are respectively formed with one first stack layer, and the other steps are formed with 2n first stack layers, n being for example 2. As a result, respective first pad structures P11 and P12 are disposed in a stair configuration. An uppermost step and a lowest step of the other steps in the first pad structures P11 and P12 may be formed with 2n or less first stack layers, respectively. In this example, n may be 2.

The second pad structures P21 and P22 include second stack layers, and are connected at the other side of the cell structure C. In particular, the second pad structures P21 and P22 are disposed at opposite sides from the first pad structures P11 and P12. The n second pad structures P21 and P22 are formed in the second contact regions CT2-1~CT2-3, n being for example 2. In each of the second pad structures P21 and P22, at least one uppermost step and at least one lowest step are respectively formed with one second stack layer, and the other steps are formed with 2n second stack layers, n being for example 2. As a result, respective second pad structures P21 and P22 are disposed in a stair configuration. An uppermost step and a lowest step of the other steps in the second pad structures, P21 and P22, may be formed with 2n or less second stack layers, respectively. The n is for example 2.

The cell structure C is formed in the cell region CR, and is disposed between the first pad structures P11 and P12 and the second pad structures P21 and P22. The cell structure C may include third stack layers and channel layers (not shown) passing through the third stack layers in the stack direction of the third stack layers.

Each of the first to the third stack layers may include an interlayer insulating layer and a conductive layer. For example, the first stack layers may include a first interlayer insulating layer and a first conductive layer, the second stack layers may include a second interlayer insulating layer and a second conductive layer, and the third stack layers may include a third interlayer insulating layer and a third conductive layer. The first to the third conductive layers formed on the same level are connected with one another, and the first to the third interlayer insulating layers formed on the same level are connected with one another. At least one uppermost conductive layer of the first to third conductive layers may be the upper select line, at least one lowest conductive layer of the first to third conductive layers may be the lower select line, and the other layers of the first to third conductive layers may be the word lines.

The first and second pad structures P11~P22 are extended in the direction opposite to the cell structure C, and are disposed in a stair configuration. That is, the first and second pad structures P11~P22 are extended in a first direction I-I'. The second pad structures P21 and P22 are extended in the direction opposite to the extension direction of the first pad structures P11 and P12.

Ends of the stack layers are exposed at an upper surface of respective steps in the first and the second pad structures P11~P22 disposed in a stair configuration. Hereinafter, the portion exposed at the upper surface of respective steps will be defined as a pad portion of the stack layer. For example, in the event that at least one uppermost stack layer of the stack layers in the stack structure includes the upper select line, at least one lowest stack layer of the stack layers includes the lower select line, and the other stack layers include the word lines, pad portions are defined at ends of stacked lower select line, word lines and upper select line, respectively.

Particularly, adjoining first pad structures P11 and P12 in a second direction II-II' have a one step difference, and adjacent second pad structures P21 and P22 in the second direction II-II' have a one step difference. A pair of the first and second pad structures P11/P21 and P12/P22 facing each other have an n step difference, n being for example 2. Accordingly, the first pad structures P11 and P12 are asymmetric, and the second pad structures are asymmetric. The first pad structures P11 and P12 and the second pad structures P21 and P22 facing each other are asymmetric.

In the first and the second pad structures P11~P22, at least one of the uppermost step and the lowest step has a symmetric stair shape, and the other steps have an asymmetric stair shape. The pad portions of the upper select line and the lower select line, formed by using the symmetric stair shape, have substantially the same height, without step difference. Accordingly, a lower select transistor and an upper select transistor of strings included in one memory block may be easily controlled. Since the pad portions of the word lines formed by using an asymmetric stair shape are separately formed in the first and the second pad structures P11~P22, the area of the contact region in accordance with the present invention may be smaller than that in the conventional technique.

The number of the etched stack layers is written on the pad portions in FIG. 1, to show the step difference between the pad portions. For example, the pad portion of the lower select line is defined by etching thirteen stack layers in the contact regions CT1-3 and CT2-3, and the pad portion of the upper select line is defined without etching any stack layers in the contact regions CT1-1 and CT2-1. Twelve pad portions for the word lines are defined by selectively etching the stack layers in the contact regions CT1-2 and CT2-2.

The number of stack layers is 14 in FIG. 1, but the number of stack layers need not be limited to 14. The number of stack layers in one stack structure may be changed according to the number of the select transistors and the memory cells in one string.

Figure 2A:
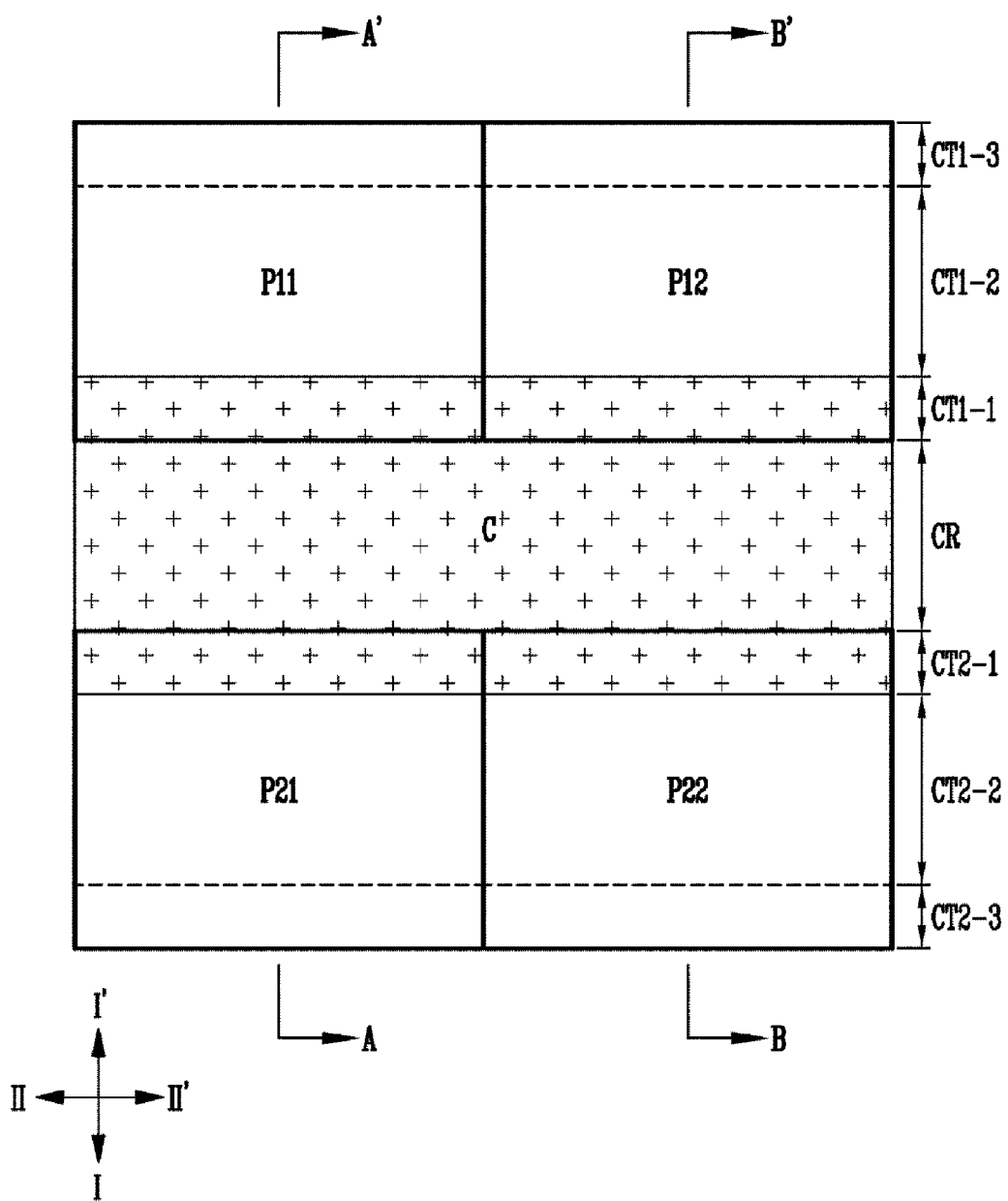
FIG. 2a to FIG. 4c are views illustrating a process of manufacturing a semiconductor device according to one embodiment of the present invention.

FIG. 2a to FIG. 4c are views illustrating a process of manufacturing a semiconductor device according to one embodiment of the present invention. FIG. 2a, FIG. 3a and FIG. 4a illustrate layouts, and FIG. 2b, FIG. 3b, FIG. 4b and FIG. 4c show sections taken along the line A-A' or the line B-B'.

Figure 2B:
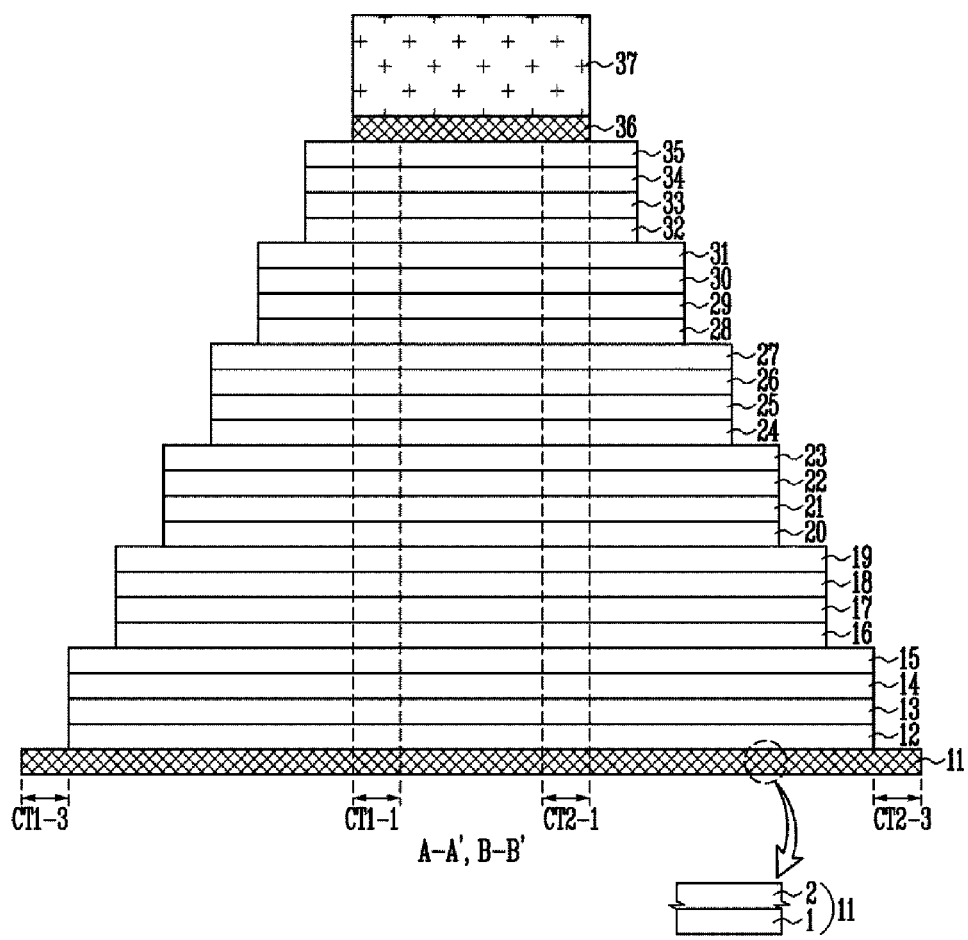

As shown in FIG. 2a and FIG. 2b, stack layers 11 to 36 are formed on a substrate (not shown), the cell region CR and the first and the second contact regions CT1-1~CT1-3 and CT2-1~CT2-3 (located at both sides of the cell region CR) are defined in the substrate.

At least one uppermost stack layer 36 of the stack layers 11 to 36 is a layer for forming the upper select line, at least one lowest stack layer 11 of the stack layers 11 to 36 is a layer for forming the lower select line, and the other stack layers 12 to 35 are layers for forming the word lines.

Each of the stack layers 11 to 36 may include a first material layer 1 and a second material layer 2. For example, the second material layer 2 and the first material layer formed below the second material layer 2 form one stack layer 11 to 36, or the second material layer 2 and the first material layer 1 formed on the second material layer 2 form one stack layer 11 to 36. The stack structure may include alternately stacked first material layers 1 and second material layers 2.

The first material layer 1 is a layer for forming the word line or the select line, and the second material layer 2 is a layer for dividing stacked conductive layers. Thicknesses of the first material layers 1 may vary depending on their usage. The conductive layer for the select line may be formed with substantially the same thickness as the conductive layer for the word line. The conductive layer of the select line may be formed with different thickness from the conductive layer for the word line, for example with greater thickness than the conductive layer for the word line.

The first material layer 1 is formed with material having high etch selectivity to the second material layer 2, and the second material layer 2 is formed with material having high etch selectivity to the first material layer 1. For example, the first material layer 1 may be formed with a conductive layer such as a poly-silicon layer, etc., and the second material layer 2 may be formed with an insulating layer such as an oxide layer, etc. For another example, the first material layer 1 may be formed with a conductive layer such as a doped poly-silicon layer, a doped amorphous silicon layer, etc., and the second material layer 2 may be formed with a sacrificial layer such as an undoped poly-silicon layer, an undoped amorphous silicon layer, etc. For another example, the first material layer 1 may be formed with a sacrificial layer such as a nitride layer, etc., and the second material layer 2 may be formed with an insulating layer such as an oxide layer, etc.

Subsequently, a process of forming the memory cells in the cell structure C may be performed, which is not shown. For example, holes are formed through the cell structure C, and then memory layers are formed in the holes. The memory layer may include at least one of a charge blocking layer, a data storage layer, and a tunnel insulating layer. The data storage layer may include at least one of a floating gate, such as a poly-silicon layer for storing electric charges, a trap layer, such as a nitride for trapping electric charges, a nano dot, and a phase change material layer. A channel layer is formed on the memory layer.

Next, a first mask pattern 37 is formed on the stack layers 11 to 36, and then the stack layer 36 is first-etched by using the first mask pattern 37 as an etch barrier. For example, the first mask pattern 37 is formed to expose the contact regions CT1-3 and CT2-3 of the lower select line in the first and the second contact regions CT1-1~CT1-3 and CT2-1~CT2-3.

The first-etching is performed for forming the pad portion of the lower select line in the non-volatile memory device. In the event that one string includes a plurality of lower select transistors, a process of reducing the first mask pattern 37 and then first-etching one stack layer using the reduced first mask pattern 37 may be iteratively performed, to form the pad portions of the lower select lines.

Subsequently, the first mask pattern 37 is reduced, and then 2n stack layers 32 to 35 are second-etched by using the reduced first mask pattern 37 as the etch barrier, n being for example 2. In this operation, the stack layer 36 etched previously is etched together with the stack layers 32 to 35, and thus the step difference between the stack layer 36 and the stack layers 32 to 35 is maintained. Next, the process of reducing the first mask pattern 37 and then etching 2n stack layers 28 to 31 using the reduced first mask pattern 37 is iteratively performed, n being for example 2.

Subsequently, the first mask pattern 37 is reduced, and then the stack layer 35 is third-etched by using the reduced first mask pattern 37 as the etch barrier. For example, the first mask pattern 37 is reduced, to cover the cell region CR and the contact regions CT1-1 and CT2-1 of the upper select line, and expose the contact regions CT1-3 and CT2-3 of the lower select line.

The third-etching is performed for forming the pad portion of the upper select line in the non-volatile memory device. In the event that one string includes a plurality of upper select transistors, a process of reducing the first mask pattern 37 and then third-etching one stack layer 35 using the reduced first mask pattern 37 may be iteratively performed, to form the pad portions of the upper select lines.

The stack structure is patterned in a stair configuration by performing the first-etching to the third-etching, such that the pad portion of the lower select line and the pad portion of the upper select line are formed. At least one of the first-etching to the third-etching may be iteratively performed. The pad portions of the word lines are not completed by the above process, but are completed by further patterning the stack structure as described below.

Respective steps in the stack structure may have substantially the same width or different width. For example, a lower step may be wider than an upper step, considering alignment margin between the contact plugs formed by the following process and the pad portions. The reduction width of the first mask pattern 37 may decrease or increase whenever the first mask pattern 37 is reduced, and thus the width of the pad portions may be adjusted.

Figure 3A:
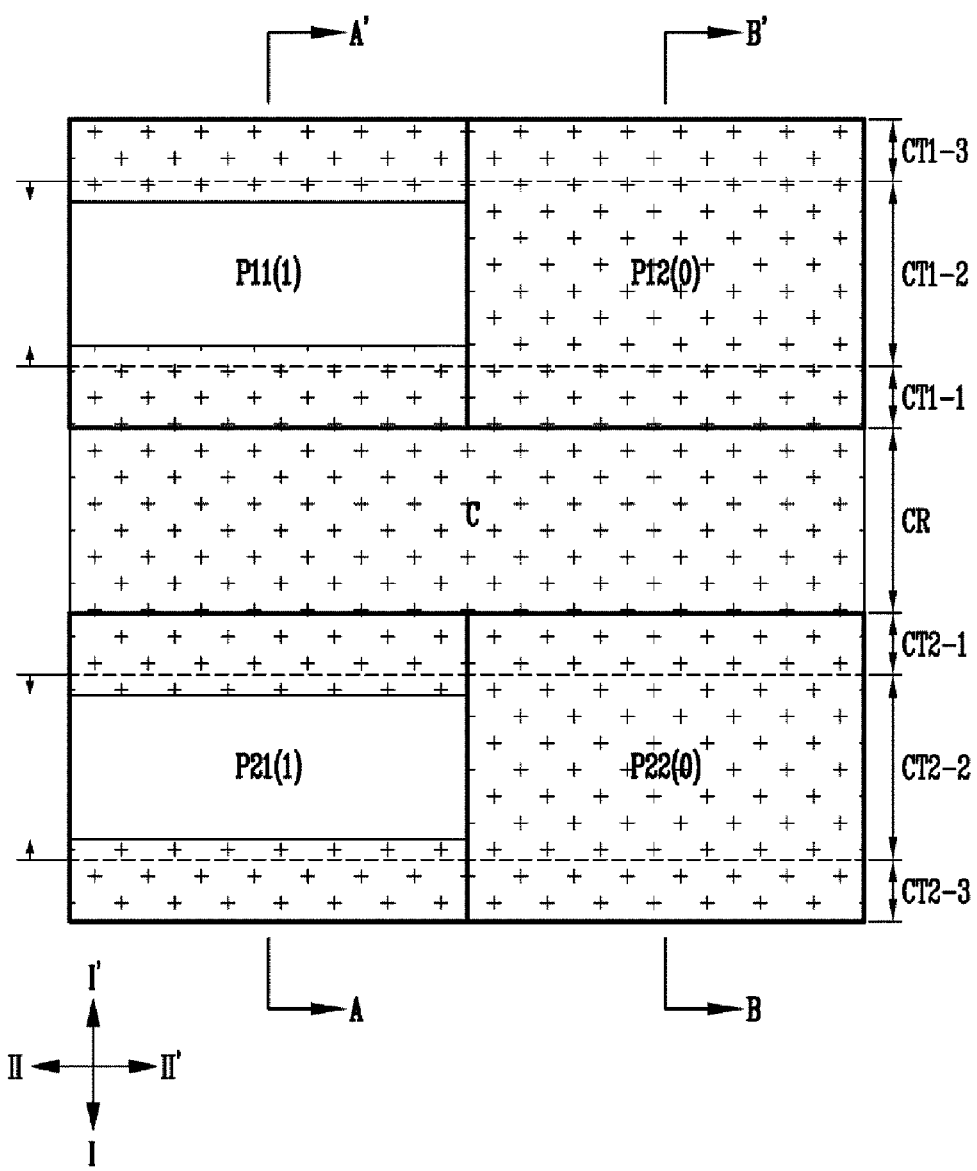
Figure 3B:
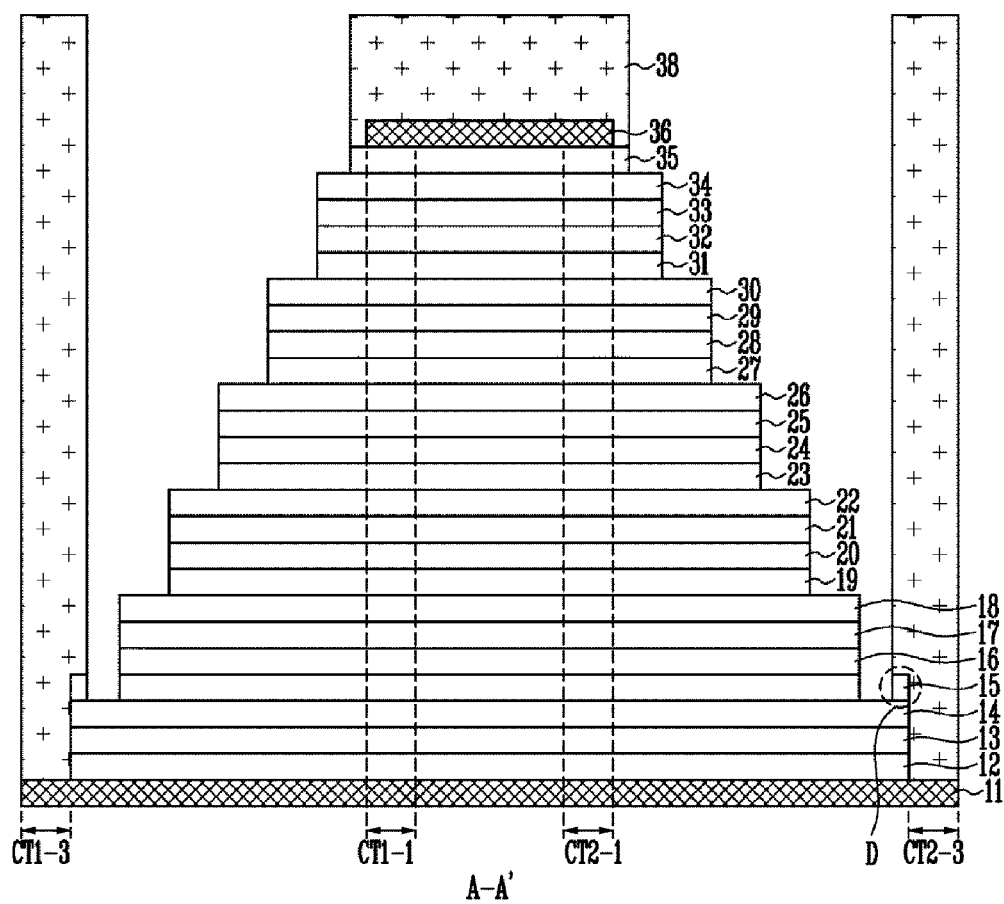
Figure 3C:
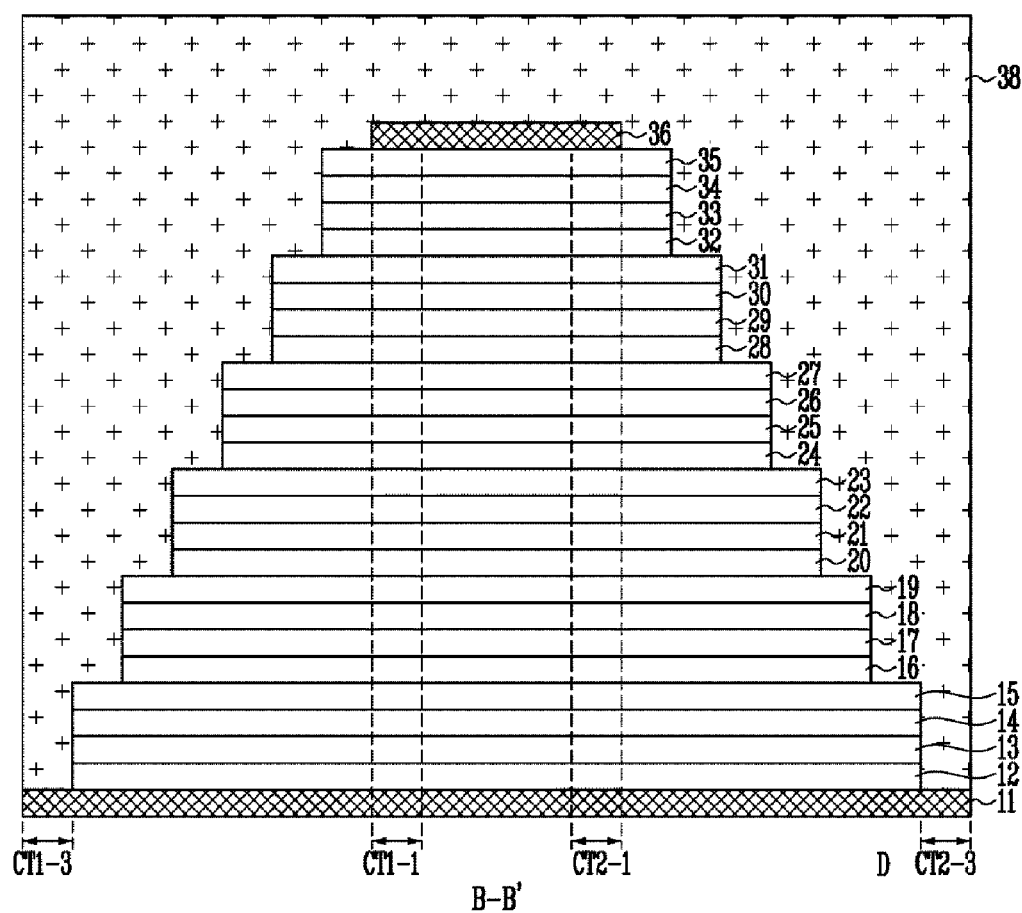

As shown in FIG. 3a to FIG. 3c, a second mask pattern 38 is formed on the stack structure, and then the stack layers 15, 19, 23, 27, 31 and 35 are etched by using the second mask pattern 38 as an etch barrier. The second mask pattern 38 is used for forming the step difference between adjoining first pad structures P11 and P12, and the step difference between adjacent second pad structures P21 and P22. Accordingly, the second mask pattern 38 may be formed to expose a pair of the first and the second pad structures P11 and P21 facing each other, and cover the cell structure C and the other first and second pad structures P12 and P22. The number of the etched stack layers is shown on the first and the second pad structures P11~P22 in the layout in FIG. 3a.

It should also be kept in mind that the second mask pattern 38 may be formed to further cover the ends of a pair of the first and the second pad structures P11 and P21 facing each other. The ends may be the contact regions CT1-1 and CT2-1 of the upper select line and the contact regions CT1-3 and CT2-3 of the lower select line. That is, the etching process is performed under the condition of covering the ends using the second mask pattern 38, and thus the pad portions of the upper and the lower select lines formed in advance are etched. As a result, a step difference may not be formed between the pad portions.

The width of the region of the second mask pattern 38 covering the end may be wider than that of the contact region CT1-1, CT2-1, CT1-3 and CT2-3 of the upper and the lower select lines, as shown by the facing arrows in FIG. 3a, to secure etch margin. In this case, the stack layer 15 of lowest step of the stack structure may be incompletely etched, and so a dummy structure D may be formed as shown in FIG. 3b.

Figure 4A:
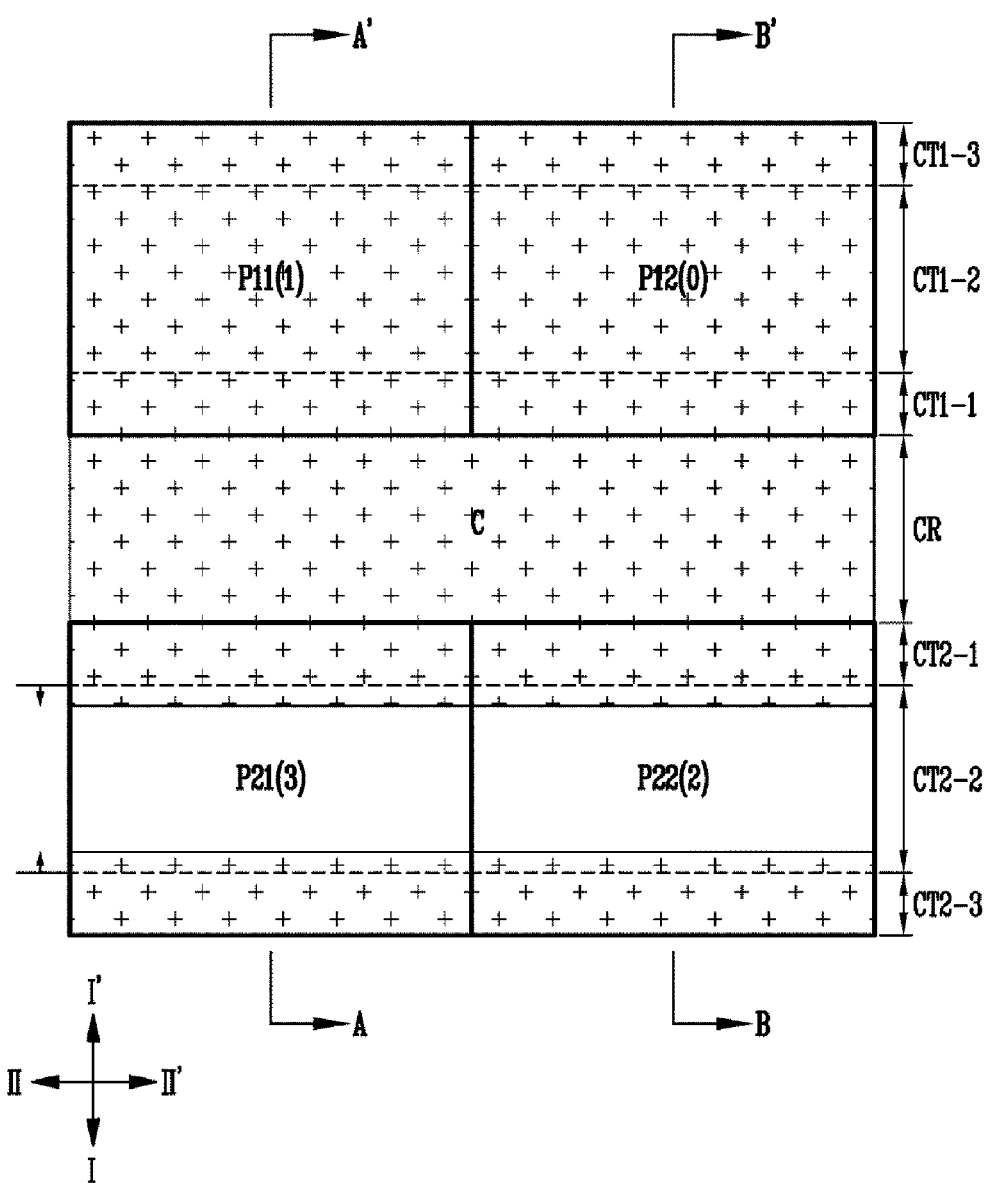
Figure 4B:
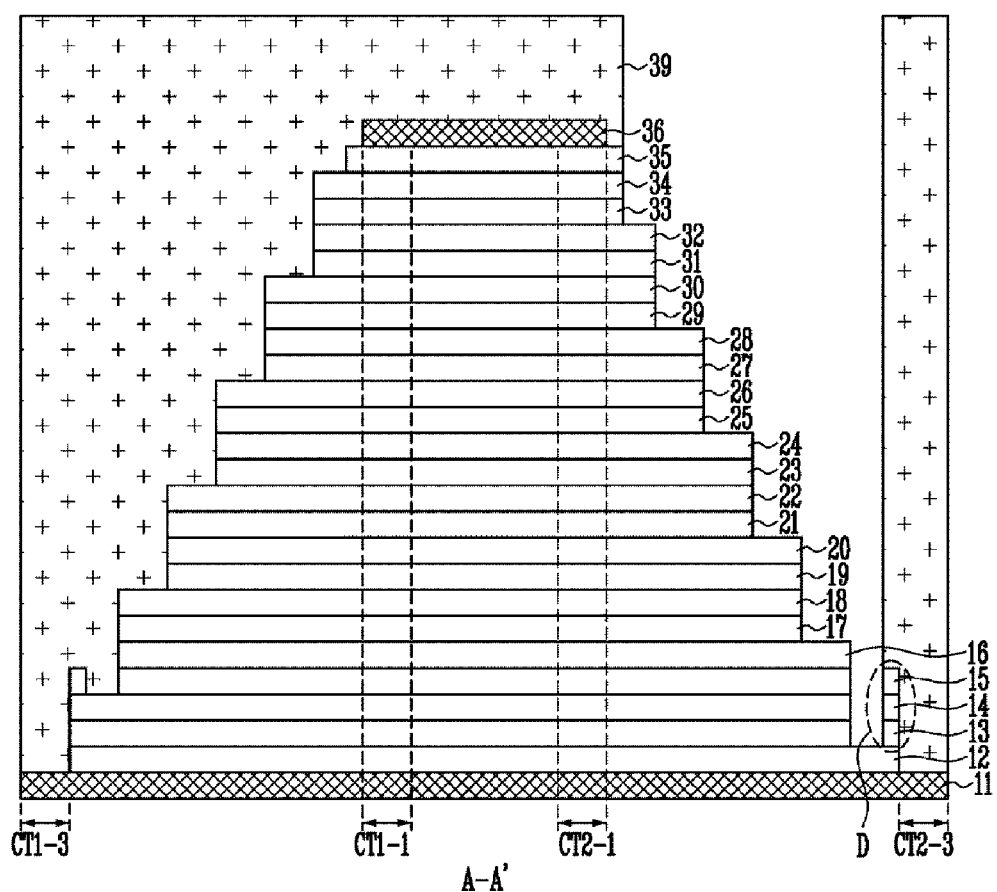
Figure 4C:
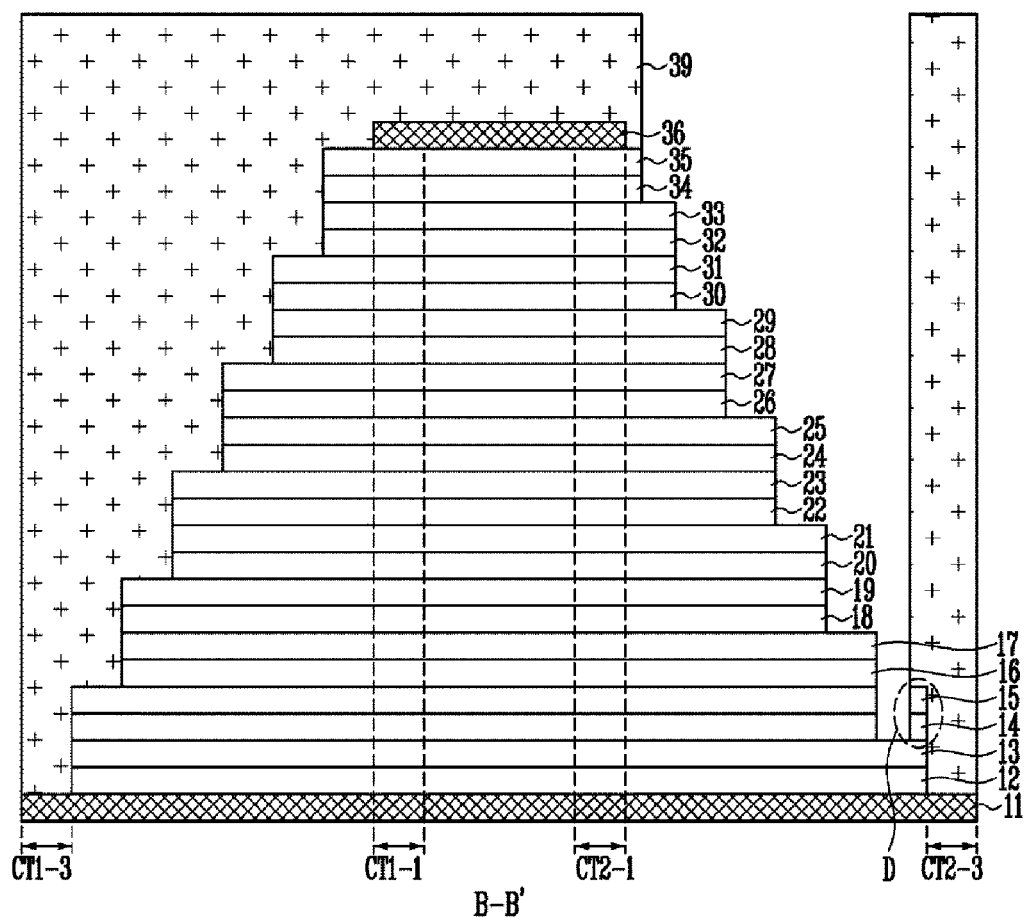

As shown in FIG. 4a to FIG. 4c, a third mask pattern 39 is formed on the stack structure, and then n stack layers are etched by using the third mask pattern 39 as an etch barrier, n being for example 2. The third mask pattern 39 is used for forming a step difference between the first pad structures P11 and P12 and the second pad structures P21 and P22 facing each other. Accordingly, the third mask pattern 39 may be formed to expose the second pad structures P21 and P22, and cover the cell structure C and the first pad structures P11 and P12. In an alternative embodiment, the third mask pattern 39 may be formed to expose the first pad structures P11 and P12 and cover the cell structure C and the second pad structures P21 and P22.

In the present example, the third mask pattern 39 may be formed to cover further the ends of the exposed first pad structures P11 and P12, or the ends of the exposed second pad structures P21 and P22. The end may be the contact region CT1-1 or CT2-1 of the upper select line and the contact region CT1-3 or CT2-3 of the lower select line. That is, the etch process is performed under the condition of covering the ends using the third mask pattern 39, and thus the pad portions of the upper and the lower select lines formed in advance are etched. As a result, a step difference may not be formed between the pad portions.

The width of a region of the third mask pattern 39 covering the end may be wider than the contact region CT1-1, CT2-1, CT1-3 and CT2-3 of the upper and the lower select lines, as shown by the facing arrows in FIG. 4a, to secure etch margin. In this case, the stack layers 13/14/15 and 14/15 of the lowest step of the stack structure may be incompletely etched, and so dummy structures D may be formed as shown in FIG. 4b and FIG. 4c. The dummy structures D occur on the lowest step of the other steps in the first and the second pad structures P11~P22.

As a result, a step difference is formed between the first and the second pad structures P11~P22. That is, a step difference is formed between adjoining first and second pad structures P11~P22 in the second direction II-II', and a step difference is formed between the first and the second pad structures P11~P22 facing in the first direction I-I'.

In an embodiment, the step difference may be formed between facing first and second pad structures P11~P22 by using the third mask pattern 39, and then the step difference may be formed between adjoining first and second pad structures P11~P22 in the second direction II-II' by using the second mask pattern 38.

Consequently, the first and the second pad structures P11~P22 having an asymmetrical stair shape are formed. Particularly, in the first and the second pad structures P11~P22, the stack layers 12~35 for the word line may have an asymmetrical stair shape, and the stack layer 11 of the lower select line and the stack layer 36 of the upper select line may have a symmetrical stair shape.

Subsequently, a process of forming the memory cells may be further performed, which is not shown. Hereinafter, processes performed in accordance with the nature of the first material layer 1 and the second material layer 2 will be described.

In an embodiment, the first material layer 1 may be formed with a conductive layer, and the second material layer 2 may be formed with an insulating layer. At least one slit is formed through the stack layers 11~36, and then the first material layers 1 exposed by the slit are silicided. Subsequently, the slit is filled with an insulating layer. During this process step, an air gap may be formed in the slit depending upon the method of depositing the insulating layer.

In another embodiment, the first material layer 1 may be formed with a conductive layer, and the second material layer 2 may be formed with a sacrificial layer. At least one slit is formed through the stack layers 11~36, and then the second material layers 2 exposed in the slits are removed. Then, regions where the second material layers 2 are removed, and the slit, are filled with an insulating layer. In this case, an air gap may be formed in the region where the second material layers 2 are removed or in the slit, depending upon the method of depositing the insulating layer.

In still another embodiment, the first material layer 1 may be formed with a sacrificial layer, and the second material layer 2 may be formed with an insulating layer. At least one slit is formed through the stack layers 11~36, and then the first material layers 1 exposed in the slit are removed. Subsequently, the word line and the select line, etc., are formed by filling the regions where the first material layers 1 are removed with a conductive layer such as tungsten W, etc. Next, the slit is filled with an insulating layer 40. In the process step, an air gap may be formed in the slit depending upon the method of depositing the insulating layer.

As described above, since the stack structure, where 2n stack layers form one step, is patterned with a stair shape, or disposed in a stair configuration, the process of forming the pad portions may be simplified compared with the conventional technique, n being for example 2. The pad portions of the lower select line and the pad portions of the upper select line may be symmetrically formed, and then the pad portions of the word lines may be asymmetrically formed. As a result, the pad portions may be effectively formed within a reduced area.

Figure 5:
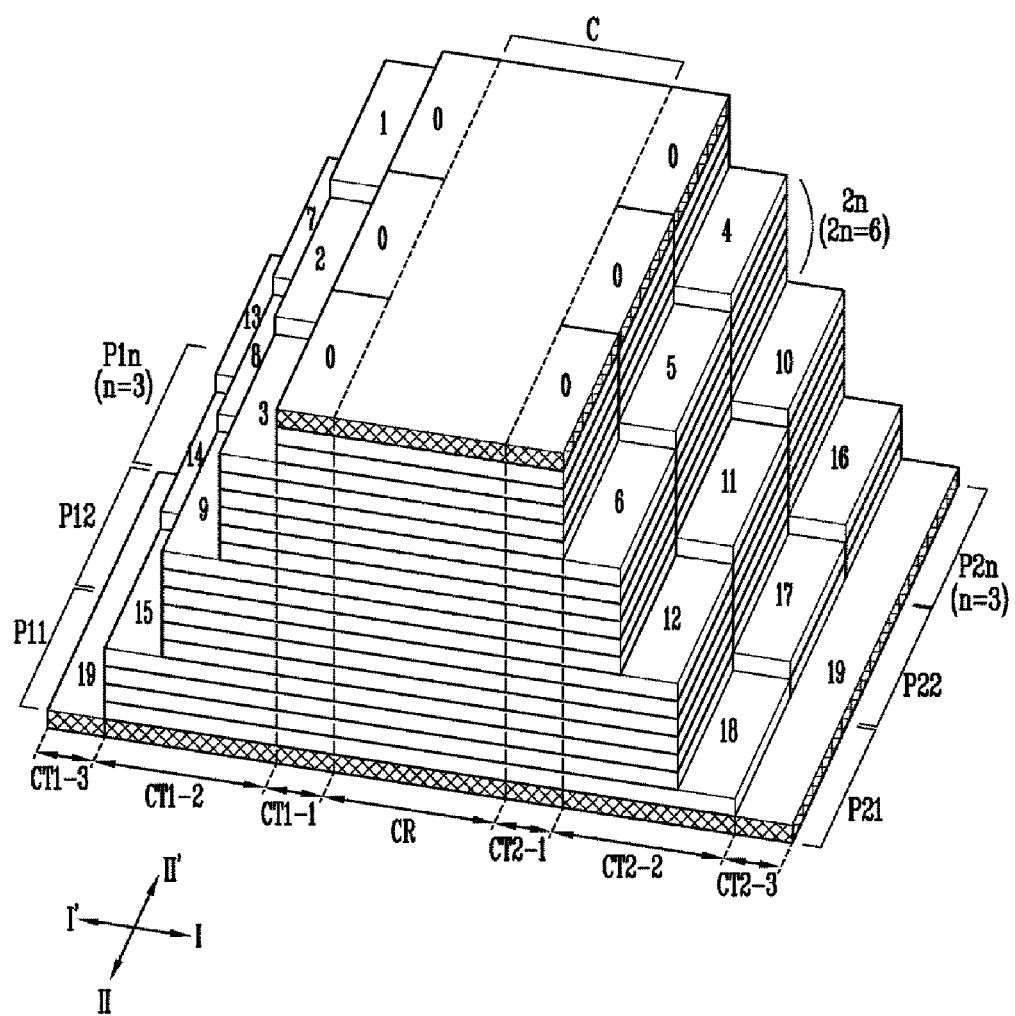
FIG. 5 is a perspective view illustrating a semiconductor memory device according to another embodiment of the present invention.

FIG. 5 is a perspective view illustrating a semiconductor device according to another embodiment of the present invention. FIG. 5 illustrates only a cell structure and a pad structure, for convenience of description. Hereinafter, any further description concerning the same elements as in FIG. 1 will be omitted.

As shown in FIG. 5, the semiconductor device in accordance with an embodiment may include a cell structure C in a cell region CR, and first and second pad structures P11~P23 in first and second contact regions CT1-1~CT1-3 and CT2-1~CT2-3. Here, n first pad structures P11~P13 are disposed in the first contact regions CT1-1~CT1-3, n being for example 3. n second pad structures P21~P23 are disposed in the second contact regions CT2-1~CT2-3, n being for example 3. In each of the first and second pad structures P11~P23, at least one uppermost step and at least one lowest step are formed with, respectively, one stack layer, and the other steps are respectively formed with 2n stack layers, n being for example 3. The first and the second pad structures P11~P23 are disposed in a stair configuration. An uppermost step and a lowest step of the other steps may be formed with 2n or less stack layers, n being for example 3.

For example, a pad portion of the lower select line is formed by etching nineteen stack layers in the contact regions CT1-3 and CT2-3, and a pad portion of the upper select line is defined without etching any stack layers in the contact regions CT1-1 and CT2-1. Eighteen pad portions of the word lines are defined by selectively etching the stack layers in the contact regions CT1-2 and CT2-2.

FIG. 6a to FIG. 9d are views illustrating a process of manufacturing a semiconductor device according to another embodiment of the present invention. FIG. 6a, FIG. 7a, FIG. 8a and FIG. 9a illustrate layouts, and FIG. 6b, FIG. 7b and FIG. 7c, FIG. 8b to FIG. 8d, and FIG. 9b to FIG. 9d show sections taken along the line A-A', the line B-B' or the line C-C'.

Figure 6A:
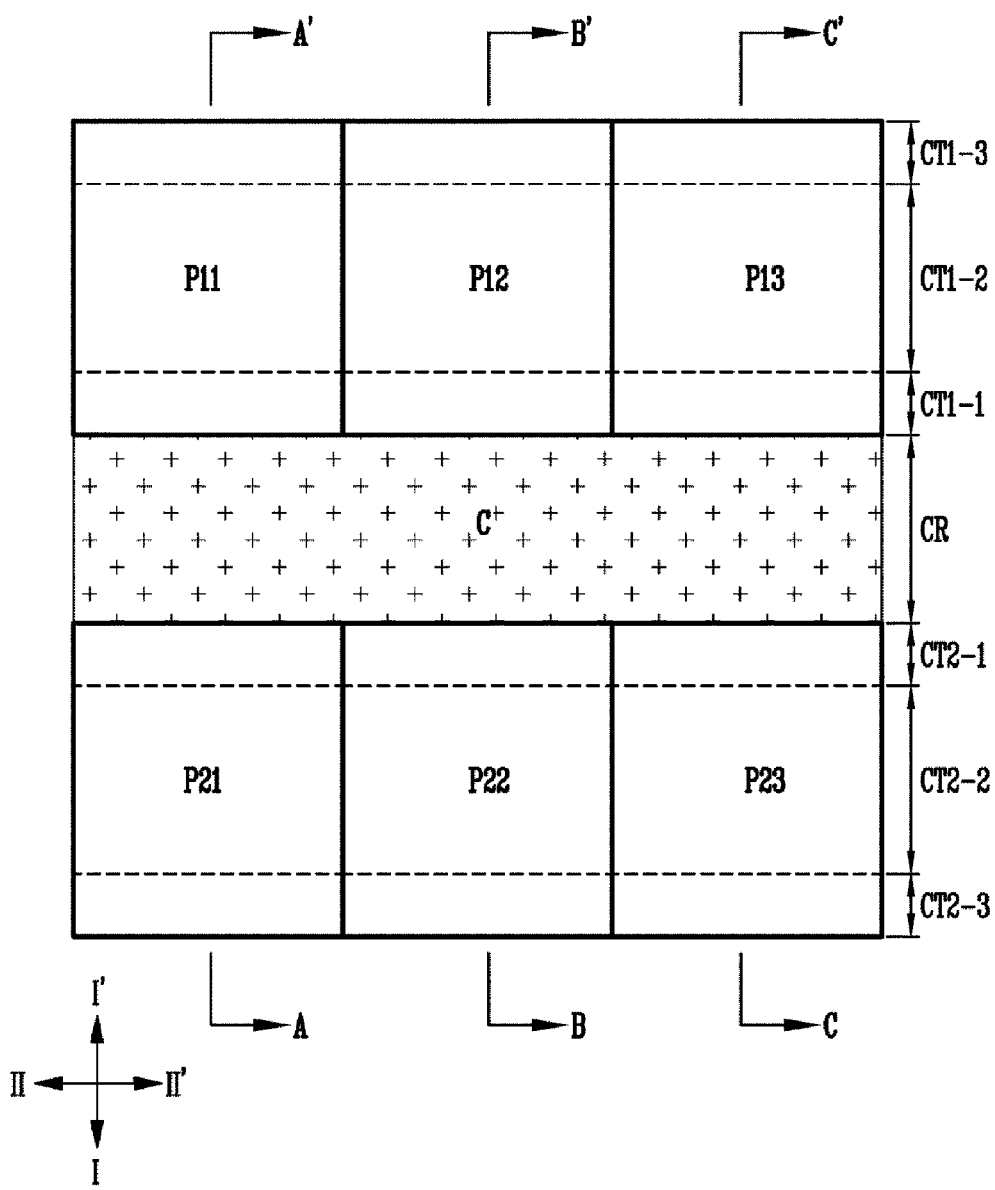

As shown in FIG. 6a and FIG. 6b, stack layers 61~86 are formed on a substrate (not shown). A cell region CR, and first and second contact regions CT1-1~CT1-3 and CT2-1~CT2-3 (disposed at both sides of the cell region CR) are defined in the substrate.

A first mask pattern 87 is formed on the stack layers 61~86, and then the stack layer 86 is first-etched by using the first mask pattern 87 as an etch barrier. Subsequently, the first mask pattern 87 is reduced, and then 2n stack layers 80~85 are second-etched by using the reduced first mask pattern 87 as an etch barrier, n being for example 3. Then, the first mask pattern 87 is reduced, and then the stack layer 62 is third-etched by using the first mask pattern 87 as an etch barrier. As a result, pad portions of the upper and the lower select lines are defined.

Figure 7B:
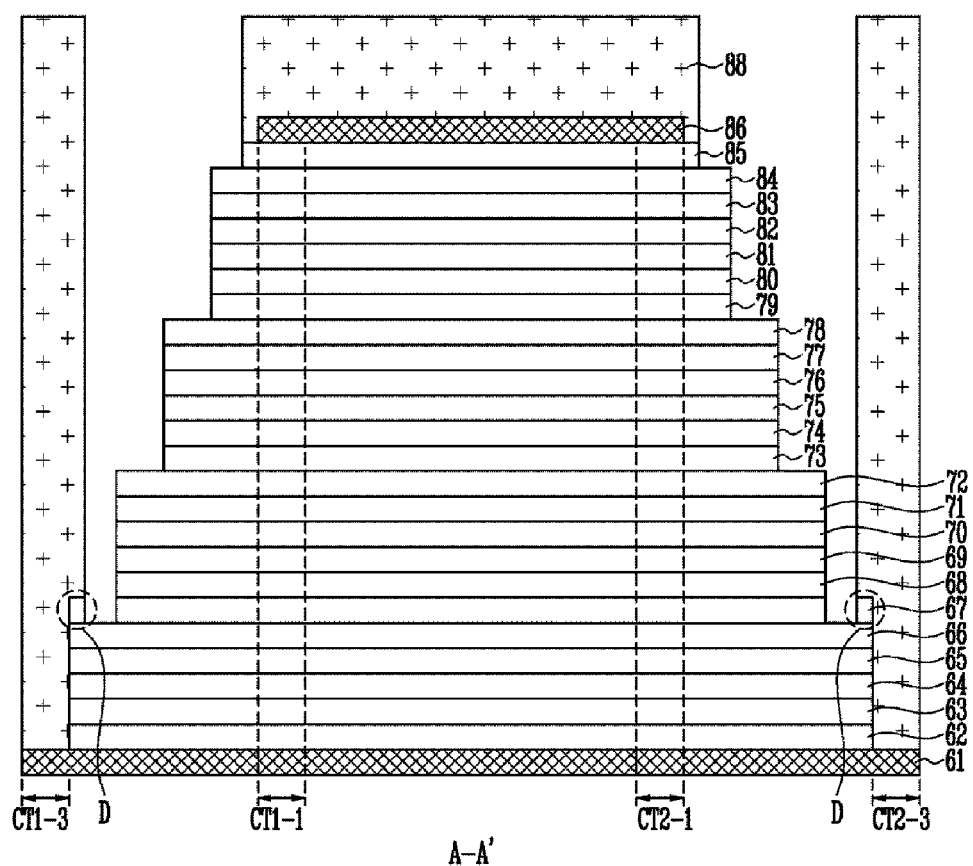
Figure 7C:
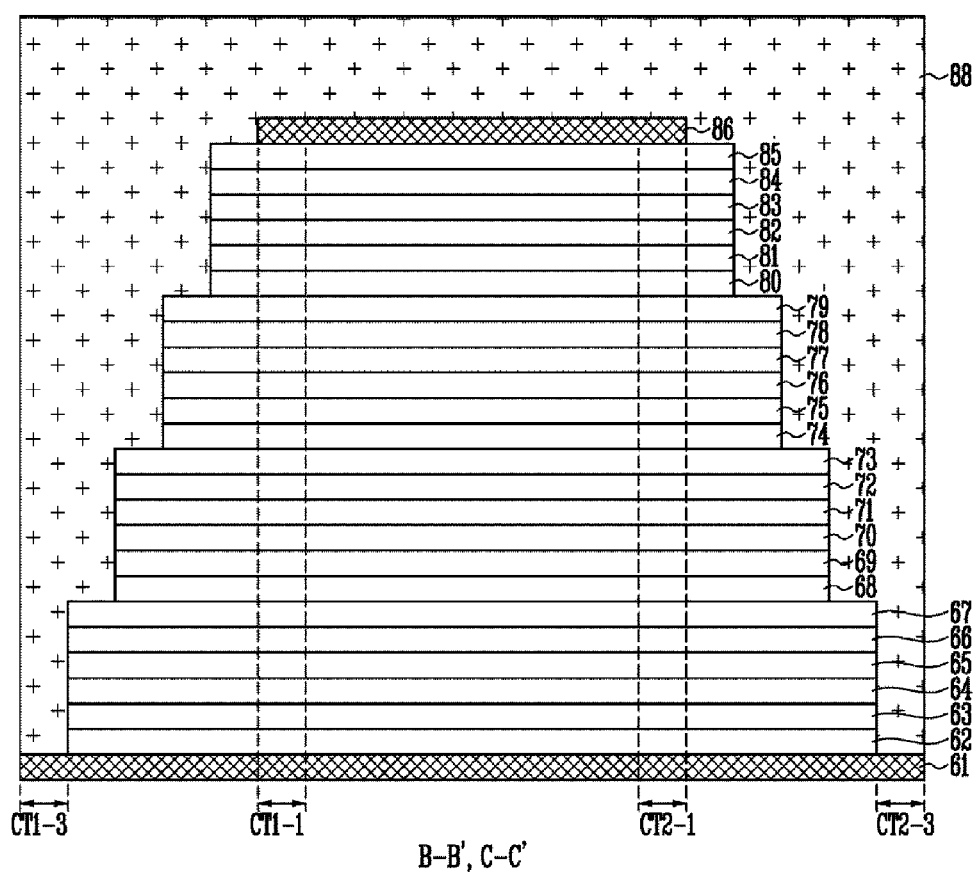
Figure 8B:
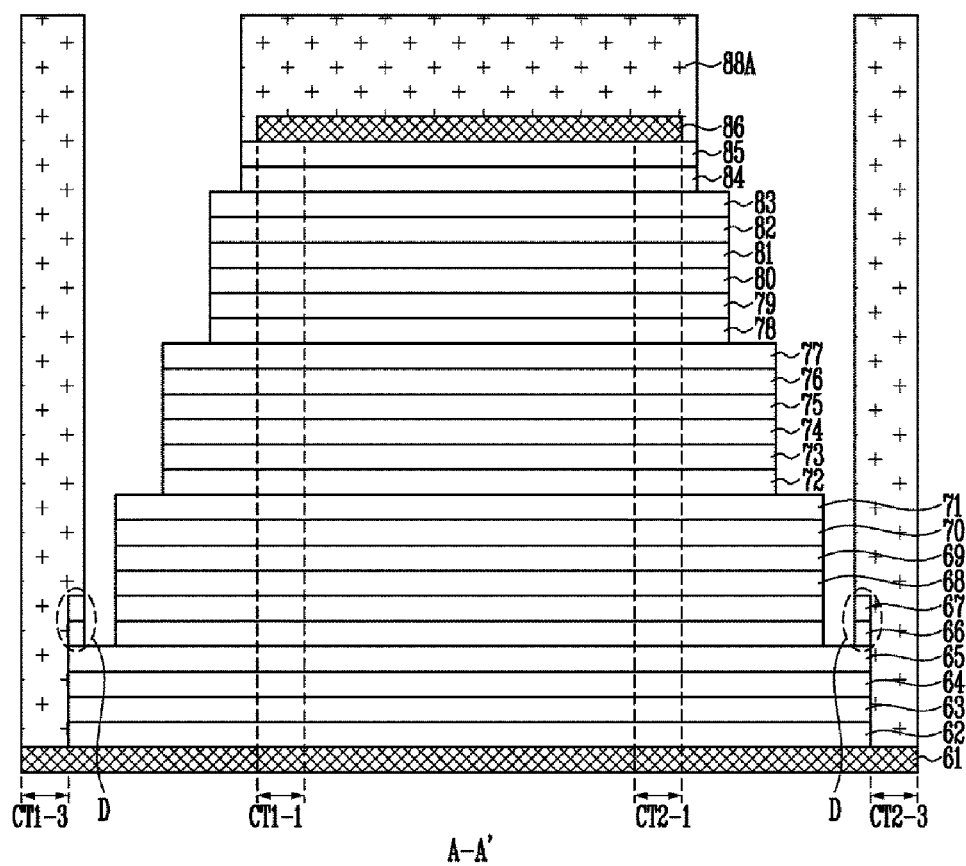
Figure 8C:
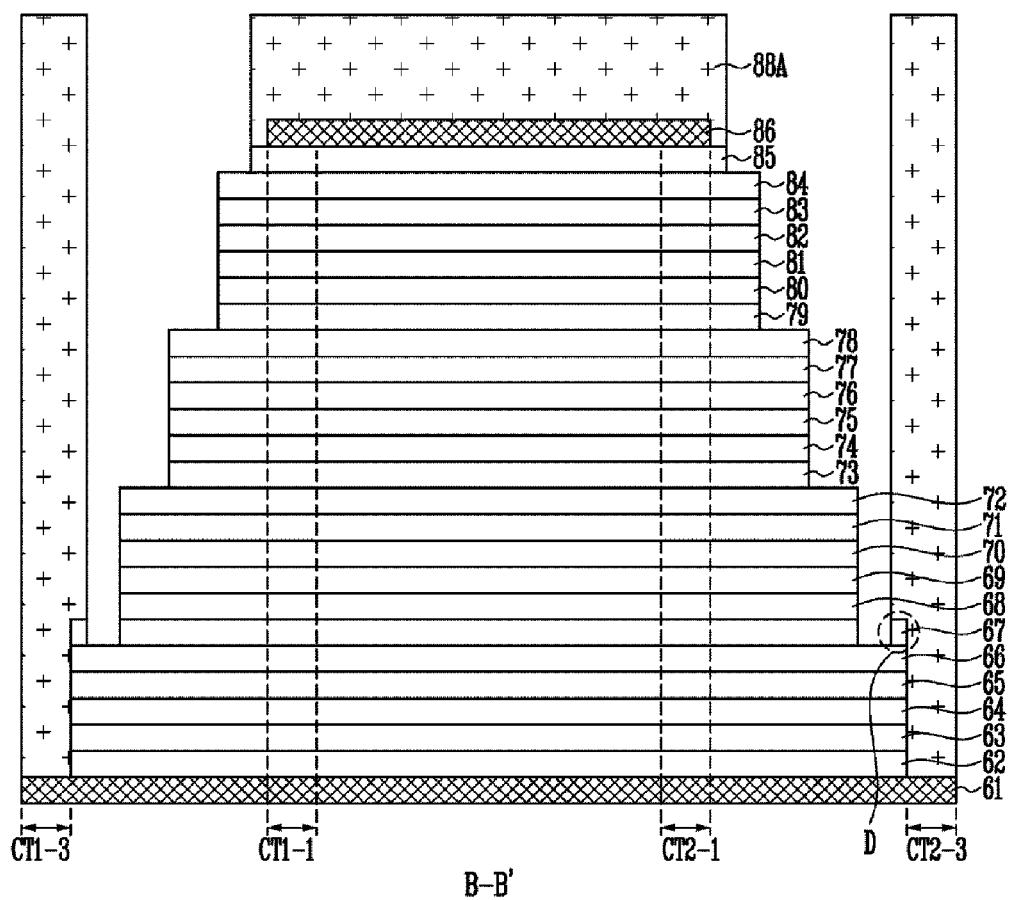
Figure 8D:
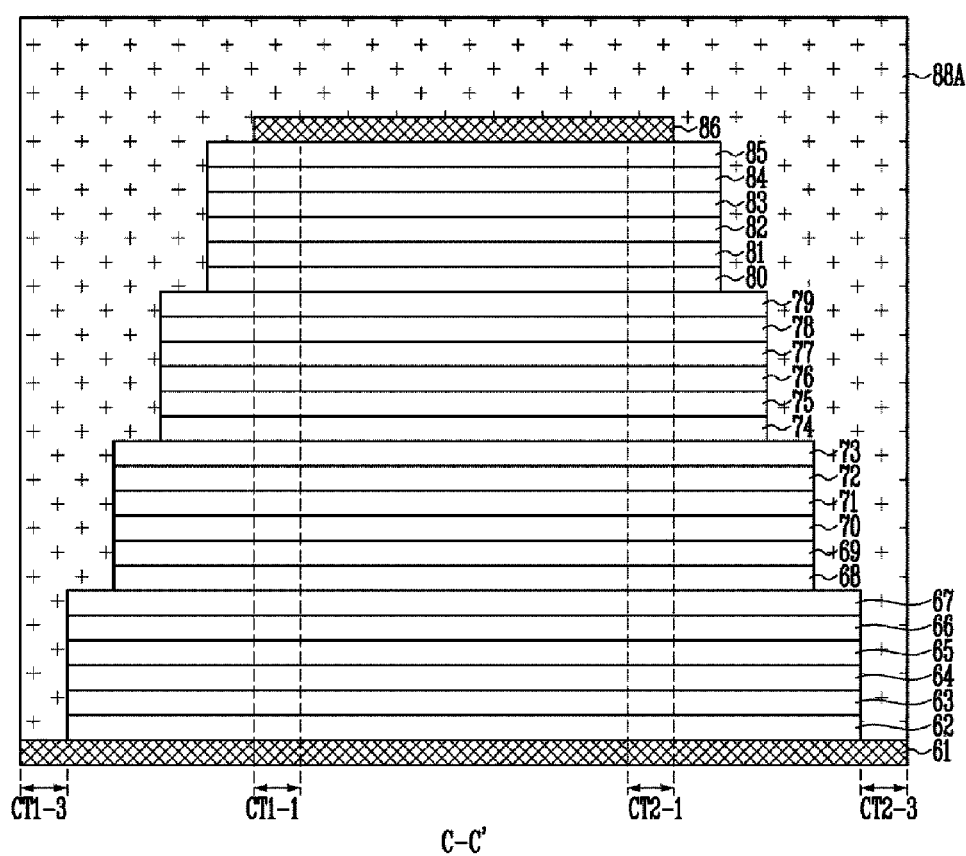
Figure 9A:
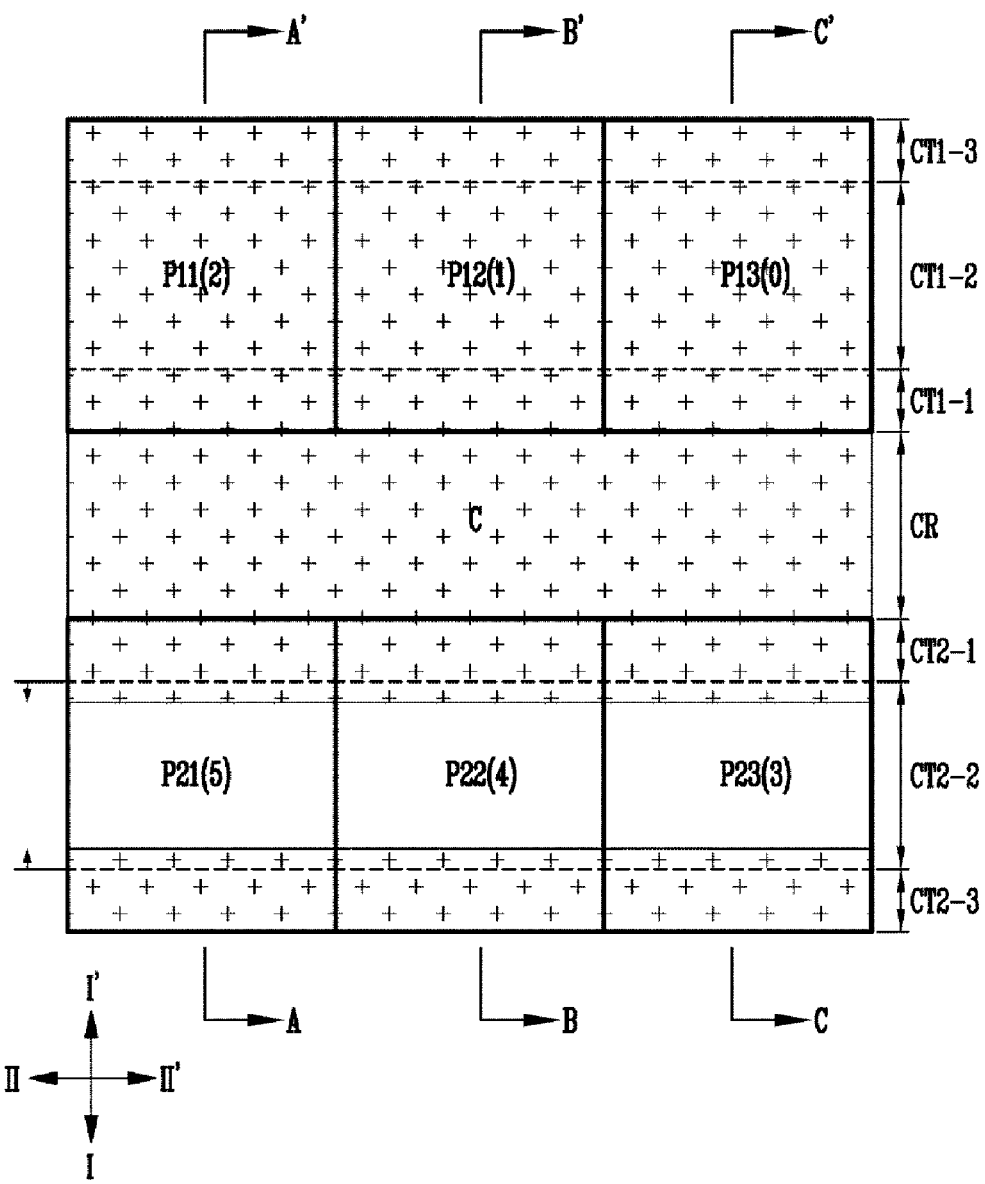
Figure 9B:
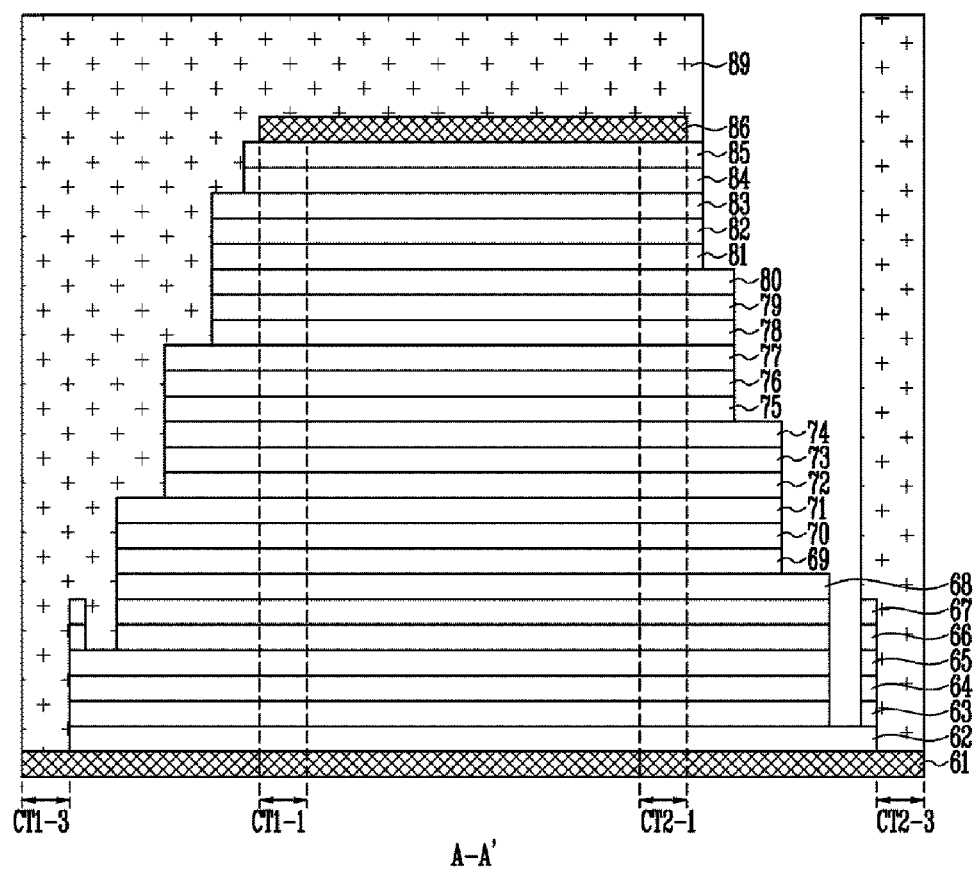
Figure 9C:
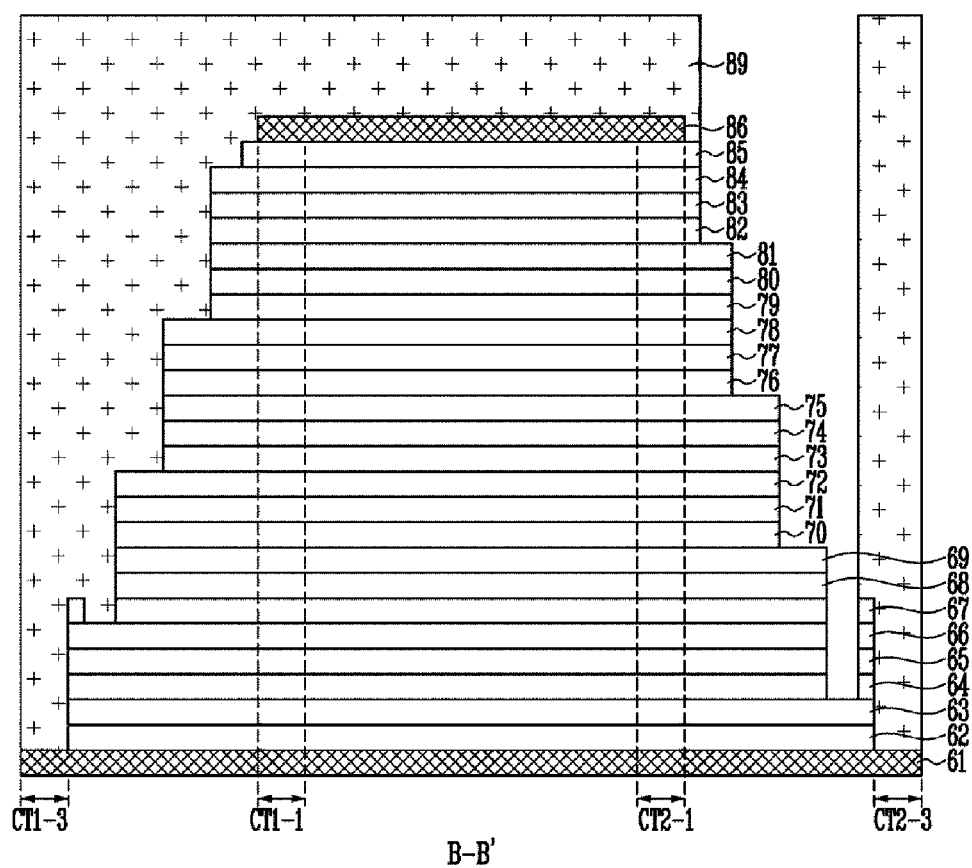
Figure 9D:
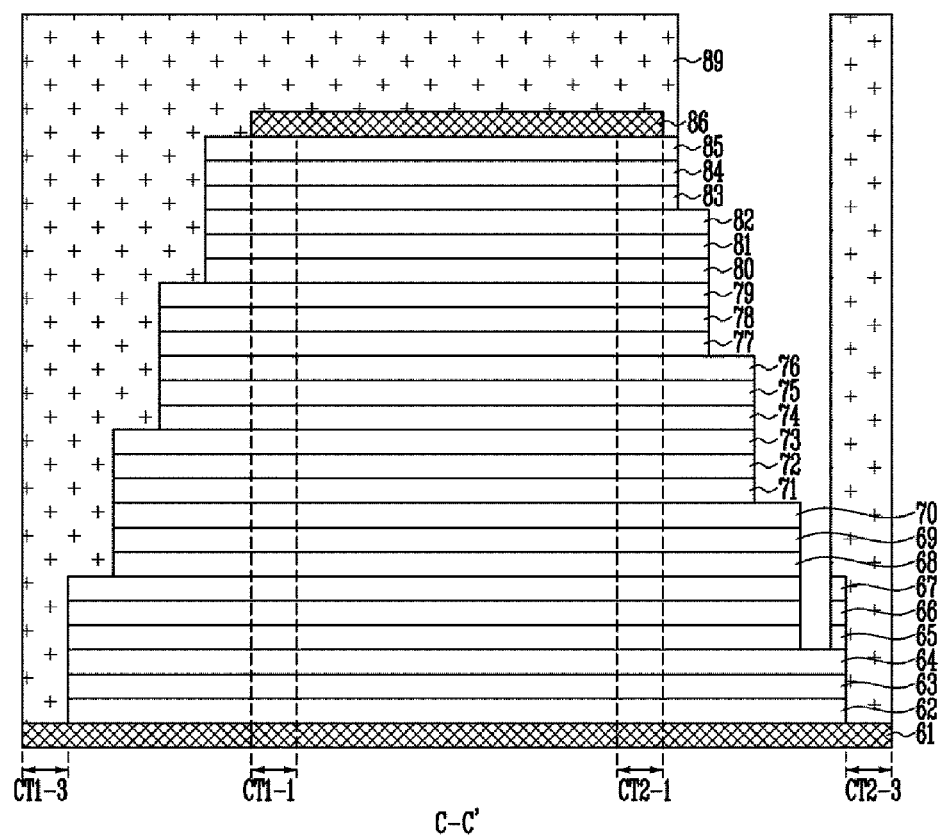

As shown in FIG. 7a to FIG. 7c, a second mask pattern 88 is formed on the stack structure, and then the stack layer 85 is etched by using the second mask pattern 88 as an etch barrier. As a result, a step difference is formed between the first and the second pad structures P11/P12 and P21/P22, by one layer.

Here, the second mask pattern 88 may be formed, to expose a pair of the first and the second pad structures P11 and P21 facing each other, and cover the cell structure C and the other first and second pad structures P12, P13, P22 and P23. The second mask pattern 88 may be formed to further cover the ends of a pair of exposed first and second pad structures P11 and P21.

The width of the region of the second mask pattern 88 covering the end may be wider than the contact region CT1-1, CT2-1, CT1-3 and CT2-3 of the upper and the lower select lines. As a result, the stack layer 67 of the lowest step of the stack structure may be incompletely etched, and so a dummy structure D may be formed.

As shown in FIG. 8a to FIG. 8d, the second mask pattern 88A is reduced in a second direction II-II' to further expose facing first and second pad structures P12 and P22, and then the stack layer 84 and 85 is etched by using the reduced second mask pattern 88A as an etch barrier.

As a result, a step difference is formed between adjoining first pad structures P11~P13 in the second direction II-II' by one layer, and a step difference is formed between adjacent second pad structures P21~P23 in the second direction II-II' by one layer. The process of reducing the second mask pattern 88A and etching the stack layer using the reduced second mask pattern 88A is iteratively performed until a step difference is formed between every pad structure P11/P12/P13 and P21/P22/P23 in one contact region. For example, in the event that each of the first and the second contact regions CT1-1~CT1-3 and CT2-1~CT2-3 includes n first or second pad structures P11~P23, the etch process is performed in conjunction with reducing the second mask pattern 88A (n−1) times.

The etch process may be iteratively performed by forming a new mask pattern instead of reducing the second mask pattern 88A.

As shown in FIG. 9a to FIG. 9d, a third mask pattern 89 is formed on the stack structure, and then n stack layers are etched by using the third mask pattern 89 as an etch barrier, n being for example 3. Here, the third mask pattern 89 may be formed, to expose the second pad structures P21~P23 and cover the cell structure C and the first pad structures P11~P13.

The third mask pattern 89 may be formed to further cover further the ends of the exposed second pad structures P21~P23. The width of the region of the third mask pattern 89 covering the end may be wider than the contact region CT1-1, CT2-1, CT1-3 and CT2-3 of the upper and the lower select lines. As a result, the stack layer 65~67 of lowest step of the stack structure may be incompletely etched, and so dummy structures D may be formed.

As a result, a step difference is formed between every first and second pad structure P11~P23.

In the above description, some of the steps in the stack structure include four or six stack layers. However, the present invention is not limited to the structures set forth in the above description. Some of the steps in the stack structure may include 2n stack layers, for example, two stack layers or eight or more stack layers.

Figure 10:
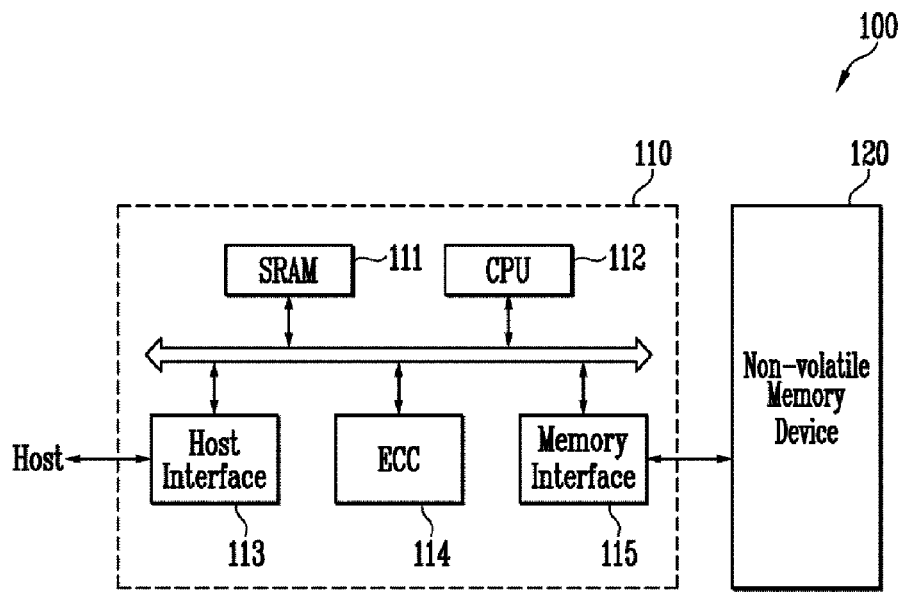
FIG. 10 is a block diagram illustrating a memory system according to one embodiment of the present invention.

FIG. 10 is a block diagram illustrating a memory system according to one embodiment of the present invention.

In FIG. 10, the memory system 100 of the present embodiment may include a non-volatile memory device 120 and a memory controller 110.

The non-volatile memory device 120 may have the structure described above. The non-volatile memory device 120 may be a multi-chip package having flash memory chips.

The memory controller 110 controls the non-volatile memory device 120, and may include an SRAM 111, a CPU 112, a host interface 113, an ECC 114 and a memory interface 115. The SRAM 111 is used as an operation memory of the CPU 112, the CPU 112 performs control operation for data exchange of the memory controller 110, and the host interface 113 has data exchange protocol of a host accessed to the memory system 100. The ECC 114 detects and corrects error of data read from the non-volatile memory device 120, and the memory interface 115 interfaces with the non-volatile memory device 120. The memory controller 110 may include further ROM for storing data for interfacing with the host, etc.

The memory system 100 may be used as a memory card or a solid state disk SSD by combination of the non-volatile memory device 120 and the memory controller 110. In the event that the memory system 100 is the SSD, the memory controller 110 communicates with an external device, e.g. host through one of various interface protocols such as USB, MMC, PCI-E, SATA, PATA, SCSI, ESDI, IDE, etc.

Figure 11:
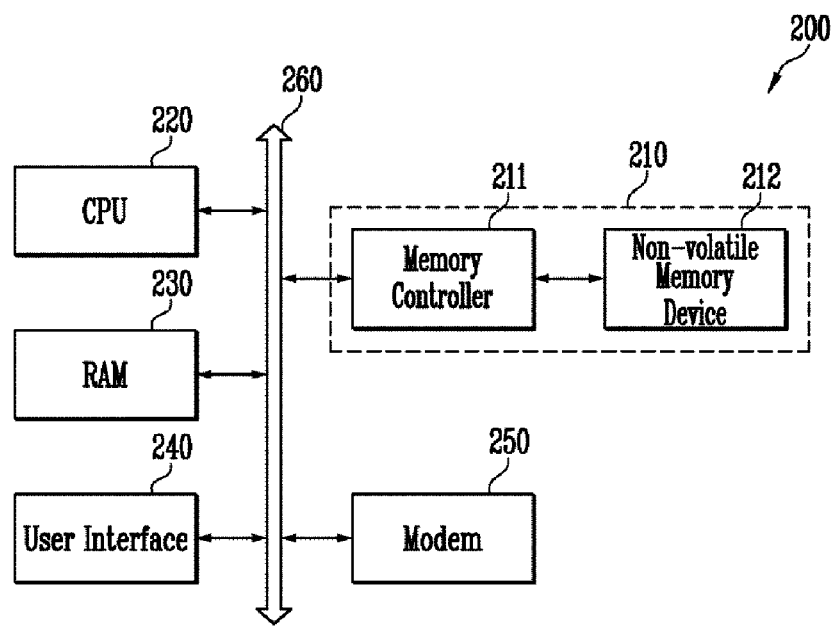
FIG. 11 is a view illustrating a computing system according to one embodiment of the present invention.

FIG. 11 is a view illustrating a computing system according to one embodiment of the present invention.

In FIG. 11, the computing system 200 of the present embodiment may include a CPU 220 connected electrically to a system bus 260, a RAM 230, a user interface 240, a modem 250 and a memory system 210. In case that the computing system 200 is a mobile device, a battery (not shown) for supplying an operation voltage to the computing system 200 may be further provided. The computing system 200 of the present invention may further include an application chipset, a CMOS image processor CIS, a mobile DRAM, etc.

The memory system 210 may include a non-volatile memory 212 and a memory controller 211 as described in FIG. 10.

While certain embodiments have been described above, it will be understood by those skilled in the art that the embodiments described are by way of example only. Various modifications, additions, and substitutions are possible, without departing from the scope and spirit of the invention. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
   n first pad structures including first stack layers disposed in a stair configuration, with a step difference being formed between the first pad structures and n being a natural number greater than or equal to 1;
n second pad structures including second stack layers disposed in a stair configuration, with a step difference being formed between the second pad structures; and
a cell structure disposed between the first pad structures and the second pad structures,
wherein, in the first pad structures, at least one uppermost step and at least one lowest step include, respectively, one first stack layer, while the other step includes 2n first stack layers, and
in the second pad structures, at least one uppermost step and at least one lowest step include, respectively, one second stack layer, while the other step includes 2n second stack layers.

2. The semiconductor device of claim 1, wherein a step difference of n layers is formed between facing first and second pad structures.

3. The semiconductor device of claim 1, wherein a step difference is formed between adjoining first pad structures by one layer, and a step difference is formed between adjacent second pad structures by one layer.

4. The semiconductor device of claim 1, wherein at least one uppermost step of the first and the second pad structures is an upper select line, at least one lowest step of the first and the second pad structures is a lower select line, and the other steps are word lines.

5. The semiconductor device of claim 1, wherein an uppermost step or a lowest step of the other steps in the first pad structures is formed with 2n or less first stack layers, and an uppermost step or a lowest step of the other step in the second pad structures is formed with 2n or less second stack layers.

6. The semiconductor device of claim 1, further comprising:
at least one dummy structure located on the lowest step of the other steps in the first and the second pad structures.

7. The semiconductor device of claim 1, wherein the first and the second pad structures are extended in the direction opposite the cell structure.

8. The semiconductor device of claim 1, wherein the cell structure includes:
third stack layers; and
a channel layer passing through the third stack layers.

9. The semiconductor device of claim 8, wherein each of the first stack layers includes a first interlayer insulating layer and a first conductive layer, each of the second stack layers includes a second interlayer insulating layer and a second conductive layer, and each of the third stack layers includes a third interlayer insulating layer and a third conductive layer.

10. The semiconductor device of claim 9, wherein the first to the third conductive layers formed at the same level are connected with one another, and the first to the third interlayer insulating layers formed at the same level are connected with one another.

11. The semiconductor device of claim 9, wherein at least one uppermost conductive layer of the first to the third conductive layers is an upper select line, at least one lowest conductive layer of the first to the third conductive layers is a lower select line, and the other conductive layers are word lines.

12. The semiconductor device of claim 9, wherein the first to the third interlayer insulating layers are formed with substantially the same material, and the first to the third conductive layers are formed with substantially the same material.

13. A memory system comprising:
a memory controller; and
a non-volatile memory device including a semiconductor device comprising:
n first pad structures including first stack layers disposed in a stair configuration, with a step difference being formed between the first pad structures and n being a natural number greater than or equal to 1;
n second pad structures including second stack layers disposed in a stair configuration, with a step difference being formed between the second pad structures; and
a cell structure disposed between the first pad structures and the second pad structures,
wherein, in the first pad structures, at least one uppermost step and at least one lowest step include, respectively, one first stack layer, while the other step includes 2n first stack layers, and
in the second pad structures, at least one uppermost step and at least one lowest step include, respectively, one second stack layer, while the other step includes 2n second stack layers.

14. The memory system of claim 13, wherein a step difference of n layers is formed between facing first and second pad structures.

15. The memory system of claim 13, wherein a step difference is formed between adjoining first pad structures by one layer, and a step difference is formed between adjacent second pad structures by one layer.

16. The memory system of claim 13, wherein at least one uppermost step of the first and the second pad structures is an upper select line, at least one lowest step of the first and the second pad structures is a lower select line, and the other steps are word lines.

17. The memory system of claim 13, wherein an uppermost step or a lowest step of the other steps in the first pad structures is formed with 2n or less first stack layers, and an uppermost step or a lowest step of the other step in the second pad structures is formed with 2n or less second stack layers.

18. The memory system of claim 13, further comprising:
at least one dummy structure located on the lowest step of the other steps in the first and the second pad structures.

19. The memory system of claim 13, wherein the cell structure includes:
third stack layers; and
a channel layer passing through the third stack layers.

20. The memory system of claim 19, wherein each of the first stack layers includes a first interlayer insulating layer and a first conductive layer, each of the second stack layers includes a second interlayer insulating layer and a second conductive layer, and each of the third stack layers includes a third interlayer insulating layer and a third conductive layer.

* * * * *